US012802148B2

(12) United States Patent
Xu et al.

(10) Patent No.: US 12,802,148 B2
(45) Date of Patent: Nov. 17, 2026

(54) METHOD FOR PREDICTING LEAKAGE RISK OF LANDFILL BASED ON DEEP LEARNING

(71) Applicants: Chinese Research Academy of Environmental Sciences, Beijing (CN); Gansu Yicheng Environmental Technology Co., Ltd, Baiyin (CN)

(72) Inventors: Ya Xu, Beijing (CN); Zhaozhi Jia, Beijing (CN); Changxin Neng, Beijing (CN); Xiangshan Xue, Beijing (CN); Xinghua Shao, Baiyin (CN); Yuqiang Liu, Beijing (CN)

(73) Assignees: Chinese Research Academy of Environmental Sciences, Beijing (CN); Gansu Yicheng Environmental Technology Co., Ltd, Baiyin (CN)

( * ) Notice: Subject to any disclaimer, the term of this patent is extended or adjusted under 35 U.S.C. 154(b) by 0 days.

(21) Appl. No.: 19/241,322

(22) Filed: Jun. 17, 2025

(65) Prior Publication Data

US 2025/0384509 A1 Dec. 18, 2025

(30) Foreign Application Priority Data

Jun. 18, 2024 (CN) ......................... 202410785611.5

(51) Int. Cl.
*G06Q 30/00* (2023.01)
*G06F 30/27* (2020.01)
*G06Q 50/26* (2012.01)

(52) U.S. Cl.
CPC ............ *G06Q 50/26* (2013.01); *G06F 30/27* (2020.01)

(58) Field of Classification Search
CPC .... G06Q 50/26; G06Q 10/0635; G06Q 10/04; G06F 30/27; G06F 18/214; G06F 18/217; G06N 3/0442; G06N 3/045; G06N 3/08
See application file for complete search history.

(56) References Cited

U.S. PATENT DOCUMENTS

| | | | | |
|---|---|---|---|---|
| 4,335,978 A * | 6/1982 | Mutch | B65G 3/02 588/259 | |
| 4,696,599 A * | 9/1987 | Rakoczynski | B09B 1/00 405/129.7 | |

(Continued)

FOREIGN PATENT DOCUMENTS

| | | | | |
|---|---|---|---|---|
| CN | 105550817 A * | 5/2016 | G06Q 10/0635 | |
| CN | 115759322 A | 3/2023 | | |

(Continued)

OTHER PUBLICATIONS

Qi, Chengdu, et al. "Contaminants of emerging concern in landfill leachate in China: A review." Emerging Contaminants 4.1 (2018): 1-10. (Year: 2018).*

(Continued)

*Primary Examiner* — Luis A Brown
(74) *Attorney, Agent, or Firm* — JEEN IP LAW, LLC

(57) ABSTRACT

Provided is a method for predicting a leakage risk of a landfill based on deep learning, which belongs to the field of prediction of leakage risks of landfills. The method includes: acquiring data of a leakage liquid to be tested, standardizing the data of the leakage liquid to be tested to obtain standard data to be tested, and inputting the standard data to be tested into a trained landfill leakage risk prediction model to obtain a landfill leakage risk prediction result. The present disclosure utilizes a long short-term memory recurrent neural network-gated recurrent unit neural network algorithm to obtain the landfill leakage risk prediction model, such that the prediction model is suitable not only for long-term (Continued)

dependent sequence data but for processing information in a short term, thereby improving the practicality and reliability of the model prediction.

4 Claims, 26 Drawing Sheets

(56) References Cited

U.S. PATENT DOCUMENTS

| | | | | |
|---|---|---|---|---|
| 5,855,664 | A * | 1/1999 | Bielecki | C04B 18/16 405/129.95 |
| 2008/0096188 | A1* | 4/2008 | Davis-Hoover | C12Q 1/689 435/6.15 |
| 2014/0182846 | A1* | 7/2014 | Fischer | B09B 1/006 166/250.15 |
| 2015/0226045 | A1* | 8/2015 | Fischer | E21B 44/00 166/250.15 |
| 2017/0190596 | A1* | 7/2017 | Breeden | C02F 1/20 |
| 2017/0328878 | A1* | 11/2017 | Xi | G01N 33/18 |
| 2019/0056287 | A1* | 2/2019 | Gao | G01N 27/205 |
| 2022/0011191 | A1* | 1/2022 | Xu | B09B 1/00 |
| 2023/0365441 | A1* | 11/2023 | Sato | C02F 1/325 |
| 2024/0135389 | A1* | 4/2024 | Wang | G06Q 30/018 |

FOREIGN PATENT DOCUMENTS

| | | | | |
|---|---|---|---|---|
| CN | 116415731 | A * | 7/2023 | G06Q 10/04 |
| KR | 102403493 | B1 * | 5/2022 | C02F 3/006 |

OTHER PUBLICATIONS

Xu, Ya, et al. "Long-term dynamics of leachate production, leakage from hazardous waste landfill sites and the impact on groundwater quality and human health." Waste Management 82 (2018): 156-166. (Year: 2018).*

Sun, Xiao-chen, et al. "Evolution of geomembrane degradation and defects in a landfill: Impacts on long-term leachate leakage and groundwater quality." Journal of Cleaner Production 224 (2019): 335-345. (Year: 2019).*

Liu, Jiangang, et al. "Study on detecting leachate leakage of municipal solid waste landfill site." Waste Management & Research 33.6 (2015): 588-592. (Year: 2015).*

Zhang, Jing, et al. "Study on the effect of municipal solid landfills on groundwater by combining the models of variable leakage rate, leachate concentration, and contaminant solute transport." Journal of environmental management 292 (2021): 112815. (Year: 2021).*

Slimani, R., et al. "Leachate flow around a well in MSW landfill: Analysis of field tests using Richards model." Waste Management 63 (2017): 122-130. (Year: 2017).*

Papadopoulou, M. P., G. P. Karatzas, and G. G. Bougioukou. "Numerical modelling of the environmental impact of landfill leachate leakage on groundwater quality—a field application." Environmental Modeling & Assessment 12.1 (2007): 43-54. (Year: 2007).*

Ergene, Didar, Ayşegül Aksoy, and F. Dilek Sanin. "Comprehensive analysis and modeling of landfill leachate." Waste Management 145 (2022): 48-59. (Year: 2022).*

* cited by examiner

METHOD FOR PREDICTING LEAKAGE RISK OF LANDFILL BASED ON DEEP LEARNING

CROSS-REFERENCE TO RELATED APPLICATION

This application claims priority of Chinese Patent Application No. 202410785611.5, filed on Jun. 18, 2024, the entire contents of which are incorporated herein by reference.

TECHNICAL FIELD

The present disclosure relates to the field of prediction of leakage risks of landfills, and in particular, to a method for predicting a leakage risk of a landfill based on deep learning.

BACKGROUND

Research on leakage risks of landfills has been a highly focused area in recent years, particularly in the use of deep learning technologies to predict leakage risks and their probabilities. Current research encompasses several aspects, including data collection and processing, application of deep learning models, feature extraction and prediction, as well as model optimization and validation.

Current methods for predicting leakage risks of landfills based on deep learning predominantly utilize long short-term memory (LSTM) recurrent neural networks and gated recurrent unit (GRU) solutions. However, the LSTM is only suitable for long-term dependent sequence data, while the GRU is only applicable for processing information over short periods. To address the aforementioned issues, the present disclosure proposes a method for predicting a leakage risk of a landfill based on deep learning using a long short-term memory recurrent neural network-gated recurrent unit solution.

SUMMARY

To overcome the shortcomings in the existing technologies, an objective of the present disclosure is to provide a method for predicting a leakage risk of a landfill based on deep learning, which is not only suitable for long-term dependent sequence data but applicable to the processing of short-term information, thereby improving the practicality and reliability of model prediction.

To achieve the above objective, the present disclosure provides the following solutions:

A method for predicting a leakage risk of a landfill based on deep learning, including:

- acquiring data of a leakage liquid to be tested, and standardizing the data of the leakage liquid to be tested to obtain standard data to be tested;
- inputting the standard data to be tested into a trained landfill leakage risk prediction model to obtain a landfill leakage risk prediction result, where the step for constructing the landfill leakage risk prediction model includes:
- collecting sample leachate data from a target landfill;
- preprocessing the sample leachate data to obtain preprocessed data;
- randomly dividing the preprocessed data into a training set and a test set;

- constructing a long short-term memory recurrent neural network-gated recurrent unit neural network structure to obtain an original training model;
- inputting the training set into the original training model for training to obtain a predicted value;
- calculating loss data of the predicted value and the test set based on a loss function; and
- determining whether the loss data has converged; if so, obtaining the landfill leakage risk prediction model; if not, updating model parameters of the long short-term memory recurrent neural network-gated recurrent unit neural network structure using an optimizer and returning to the step of "inputting the training set into the original training model for training".

Preferably, a posterior distribution calculation is performed on the landfill leakage risk prediction model to obtain posterior distribution data, and the fitting condition of the landfill leakage risk prediction model is evaluated based on the posterior distribution data.

Preferably, the leachate data includes: discharge data and drainage data.

Preferably, a structure of the original training model is constructed in PyTorch.

Preferably, the loss function includes: a mean square error, a root mean square error, a mean absolute error, and a mean absolute percentage error.

Preferably, the optimizer is an adaptive moment estimation algorithm.

Preferably, the preprocessing includes: missing value processing, abnormal value detection, and feature standardization.

Preferably, the posterior distribution includes: a coefficient of determination, a mean squared error, a root mean squared error, a mean absolute error, and a mean absolute percentage error.

According to specific embodiments provided by the present disclosure, the following technical effects are disclosed:

The present disclosure provides a method for predicting a leakage risk of a landfill based on deep learning, which belongs to the field of prediction of leakage risks of landfills. The method includes: acquiring data of a leakage liquid to be tested, standardizing the data of the leakage liquid to be tested to obtain the standard data to be tested, and inputting the standard data to be tested into a trained landfill leakage risk prediction model to obtain a landfill leakage risk prediction result. The present disclosure utilizes a long short-term memory recurrent neural network-gated recurrent unit neural network algorithm to obtain a landfill leakage risk prediction model, such that the prediction model is suitable not only for long-term dependent sequence data but also for the processing of short-term information, thereby improving the practicality and reliability of model prediction.

BRIEF DESCRIPTION OF THE DRAWINGS

In order to more clearly illustrate the technical solutions in the embodiments of the present disclosure or in the existing technologies, the following will briefly introduce the accompanying drawings required for the embodiments. It is apparent that the accompanying drawings in the following description are merely some embodiments of the present disclosure. For those of ordinary skill in the art, other accompanying drawings can be obtained based on these drawings without creative labor.

DETAILED DESCRIPTION

The technical solutions in the embodiments of the present disclosure will be described clearly and completely in conjunction with the accompanying drawings in the embodiments of the present disclosure. It is apparent that the described embodiments are merely a part of, rather than all of, the embodiments of the present disclosure. All other embodiments obtained by those of ordinary skill in the art based on the embodiments of the present disclosure without creative labor shall fall within the scope of protection of the present disclosure.

An objective of the present disclosure is to provide a method for predicting a leakage risk of a landfill based on deep learning, which is not only suitable for long-term dependent sequence data but also for the processing of short-term information, thereby improving the practicality and reliability of model prediction.

In order to make the above objectives, features, and advantages of the present disclosure more apparent and easier to understand, the present disclosure will be further described in detail below in conjunction with the accompanying drawings and specific embodiments.

Figure 1:
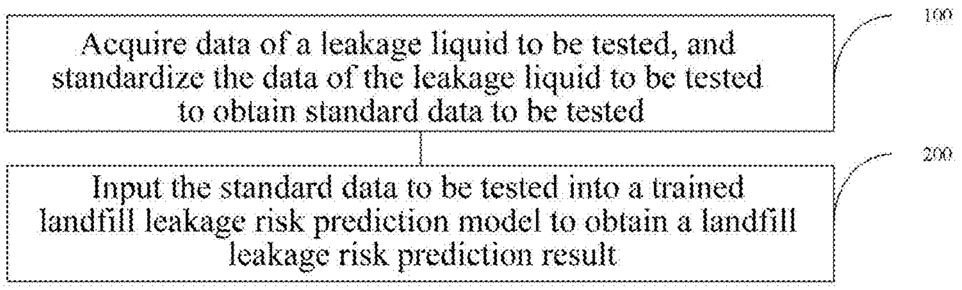
FIG. 1 is a flowchart of prediction of a leakage risk of a landfill based on deep learning provided by an embodiment of the present disclosure.

FIG. 1 is a flowchart of prediction of a leakage risk of a landfill based on deep learning. As shown in FIG. 1, the present disclosure provides a method for predicting a leakage risk of a landfill based on deep learning, including:

Step 100: acquiring data of a leakage fluid to be tested, and standardizing the data of the leakage fluid to be tested to obtain standard data to be tested.

Step 200: inputting the standard data to be tested into a trained landfill leakage risk prediction model to obtain a landfill leakage risk prediction result, where the step for constructing a landfill leakage risk prediction model includes:

- collecting sample leachate data from a target landfill;
- preprocessing the sample leachate data to obtain preprocessed data;
- randomly dividing the preprocessed data into a training set and a testing set;
- constructing a long short-term memory recurrent neural network-gated recurrent unit neural network structure to obtain an original training model;
- inputting the training set into the original training model for training to obtain a predicted value;
- calculating loss data of the predicted value and the test set based on a loss function; and
- determining whether the loss data has converged; if so, obtaining the landfill leakage risk prediction model; if no, updating model parameters of the long short-term memory recurrent neural network-gated recurrent unit neural network structure using an optimizer and returning to the step of "inputting the training set into an original training model for training".

Furthermore, a posterior distribution calculation is performed on the landfill leakage risk prediction model to obtain posterior distribution data, and a fitting condition of the landfill leakage risk prediction model is evaluated based on the posterior distribution data.

Specifically, the leachate data includes: discharge data and drainage data.

Optionally, a structure of the original training model is constructed in PyTorch.

Optionally, the loss function includes: a mean square error, a root mean square error, a mean absolute error, and a mean absolute percentage error.

Specifically, the optimizer is an adaptive moment estimation algorithm.

Specifically, the preprocessing includes: missing value processing, abnormal value detection, and feature standardization.

Optionally, the posterior distribution includes: a coefficient of determination, a mean squared error, a root mean squared error, a mean absolute error, and a mean absolute percentage error.

Furthermore, LSTM and GRU are two commonly used recurrent neural network structures, which perform exceptionally well in time series data modeling. The ability of the LSTM to capture long-term dependencies is outstanding, while the GRU can demonstrate similar performance with fewer parameters. LSTM-GRU overcomes the limitations of each by combining the advantages of long short-term memory (LSTM) and gated recurrent unit (GRU), achieving more accurate and robust leakage risk prediction to enhance the model prediction performance and robustness. The composite model initially utilizes the LSTM network to learn long-term dependencies within the time-series data of the landfill, capturing complex patterns and trends therein. Subsequently, by introducing the GRU network, the grasp of short-term sequence information by the model is strengthened, enhancing its ability to capture local features of the data. This combination effectively balances the utilization of long-term and short-term information, improving the comprehensiveness and robustness of the prediction model.

Specifically, the overall framework of the LSTM-GRU prediction model includes five functional modules: an input layer, a hidden layer, an output layer, network training, and network prediction. The input layer is responsible for preliminary processing of real-time monitoring data of leachate to meet the network input requirements. The hidden layer is constructed using a network of LSTM-GRU units, and the output layer provides the prediction results. Network training utilizes stochastic gradient descent (SGD) as the optimizer, and network prediction utilizes an iterative method.

Specifically, 3643 sets of simulation data are analyzed in this embodiment. 2914 sets of measured data are used as a training dataset for the LSTM model, GRU model, and LSTM-GRU model, while the remaining 728 sets of measured data are used as testing and validation datasets for these three models.

Furthermore, a neural network combining LSTM and GRU is constructed in PyTorch. Additionally, during the training process, the CrossEntropyLoss function is utilized to evaluate the discrepancy between model prediction and the actual labels for multi-class classification problems. An Adam optimizer is selected for parameter optimization, where a learning rate (lr) parameter, set to 0.001, influences the step size and convergence speed of the model parameter updates.

Figure 2A:
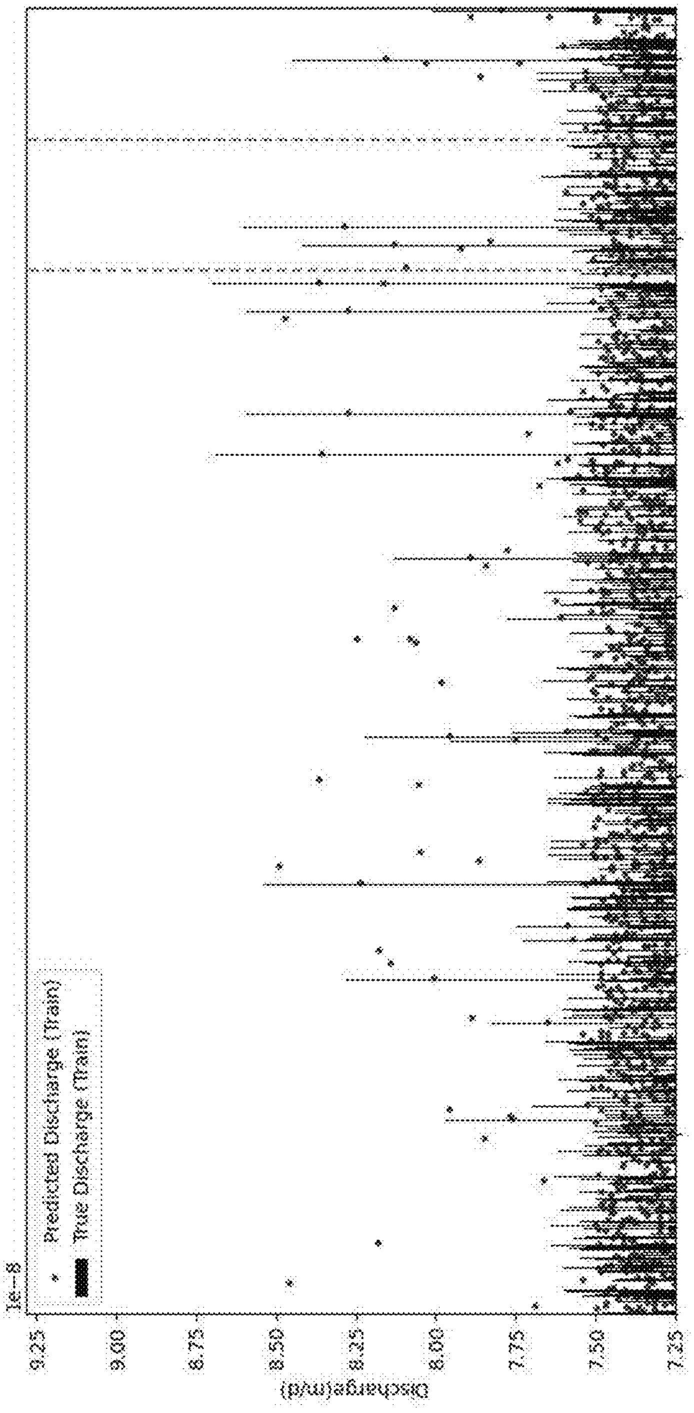
FIG. 2A is a comparison diagram of predicted values versus actual values of discharge for a training set, a validation set, and a test set of an LSTM model.
Figure 2B:
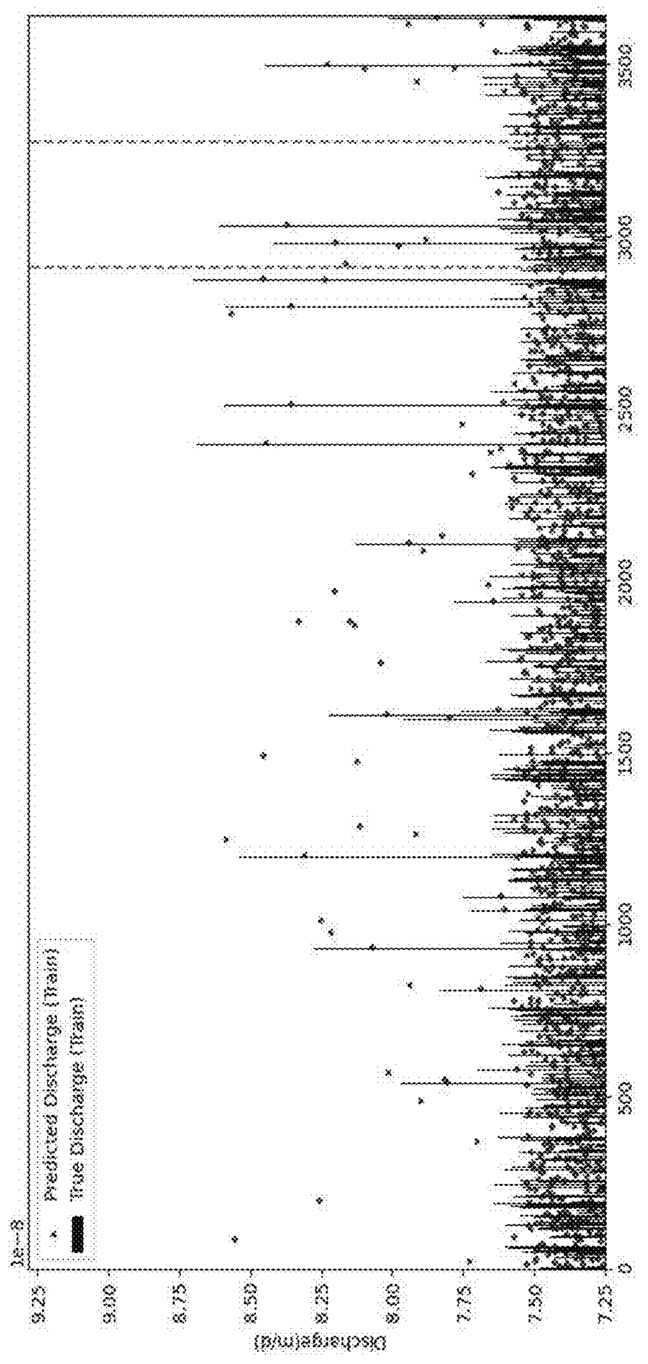
FIG. 2B is a comparison diagram of predicted values versus actual values of discharge for the training set, validation set, and test set of a GRU model.
Figure 2C:
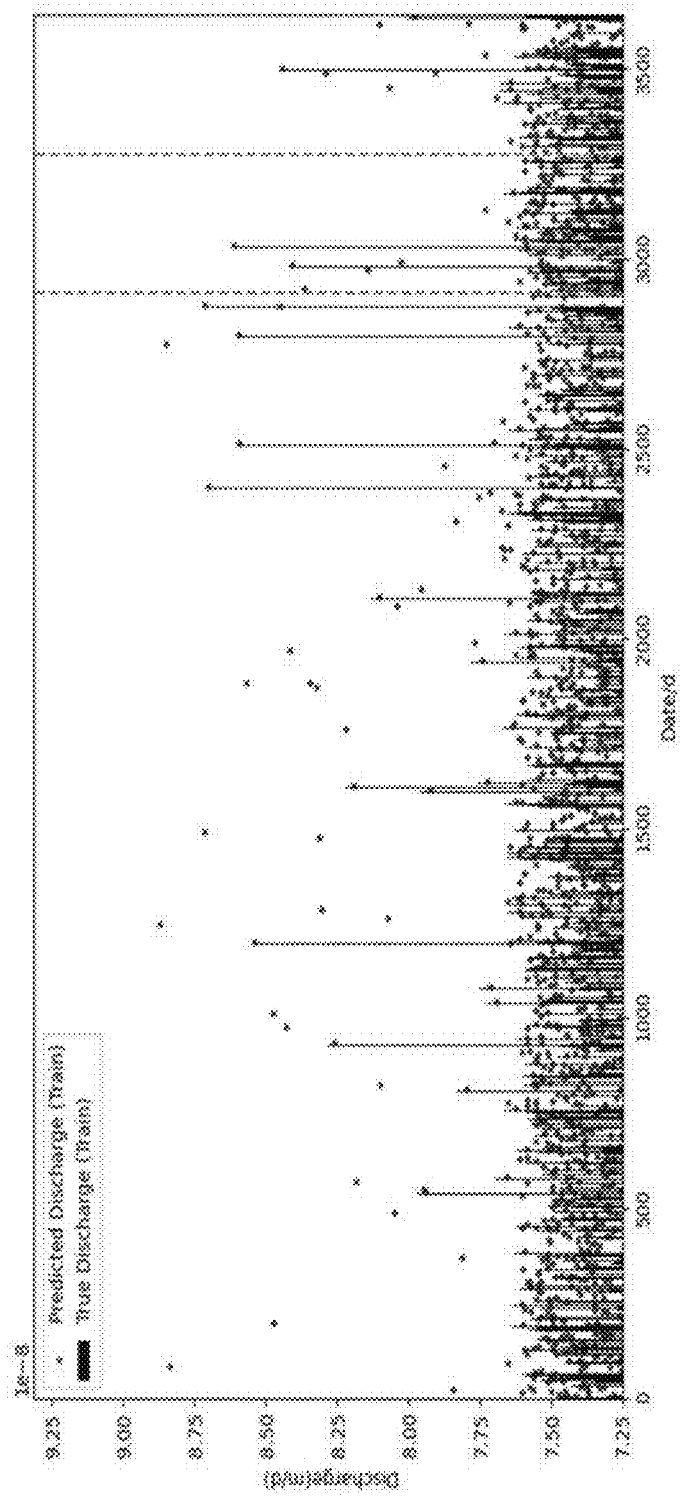
FIG. 2C is a comparison diagram of predicted values versus actual values of discharge for the training set, validation set, and test set of an LSTM-GRU model.
Figure 3A:
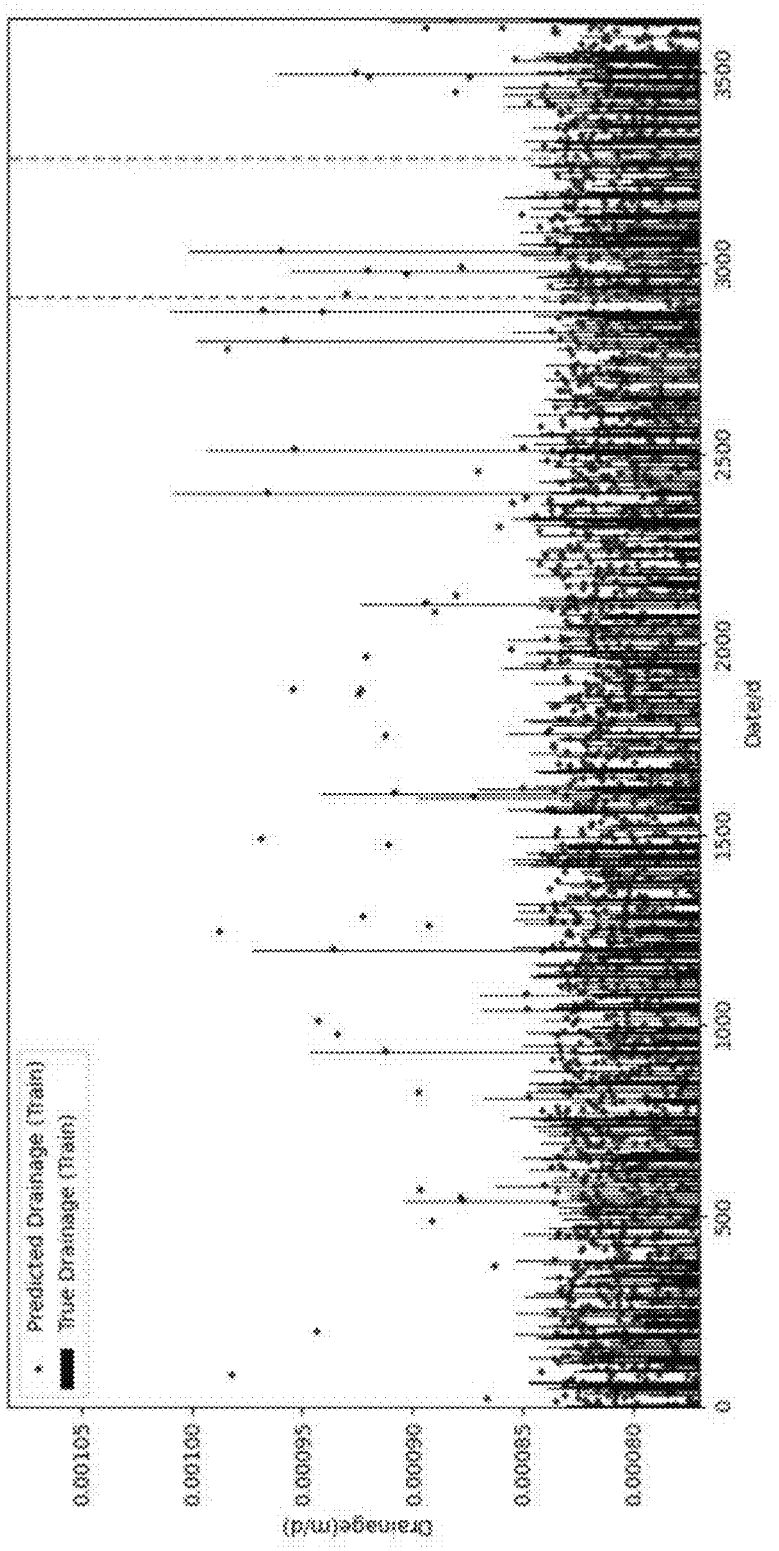
FIG. 3A is a comparison diagram of predicted values versus actual values of drainage for a training set, a validation set, and a test set of an LSTM model.
Figure 3B:
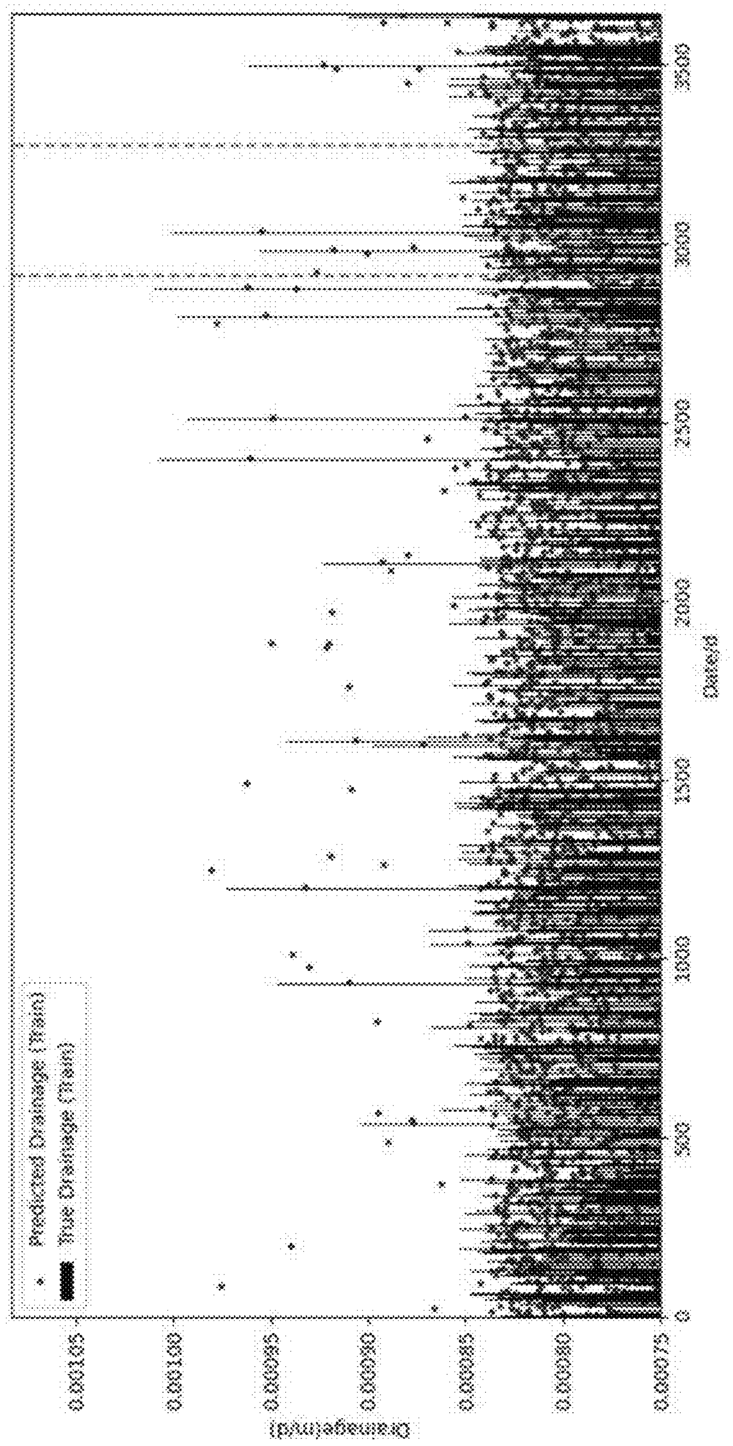
FIG. 3B is a comparison diagram of predicted values versus actual values of drainage for the training set, validation set, and test set of a GRU model.
Figure 3C:
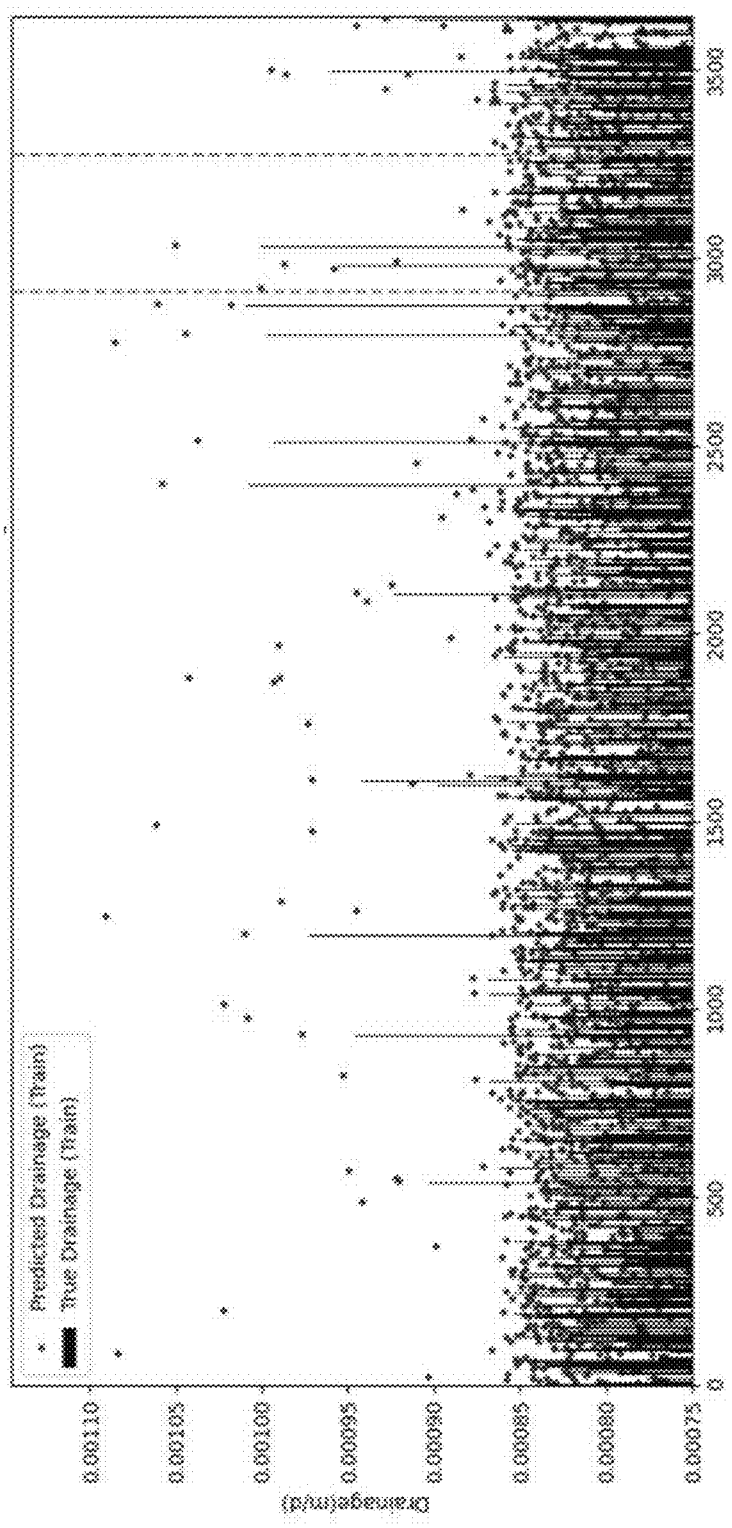
FIG. 3C is a comparison diagram of predicted values versus actual values of drainage for the training set, validation set, and test set of an LSTM-GRU model.
Figure 4A:
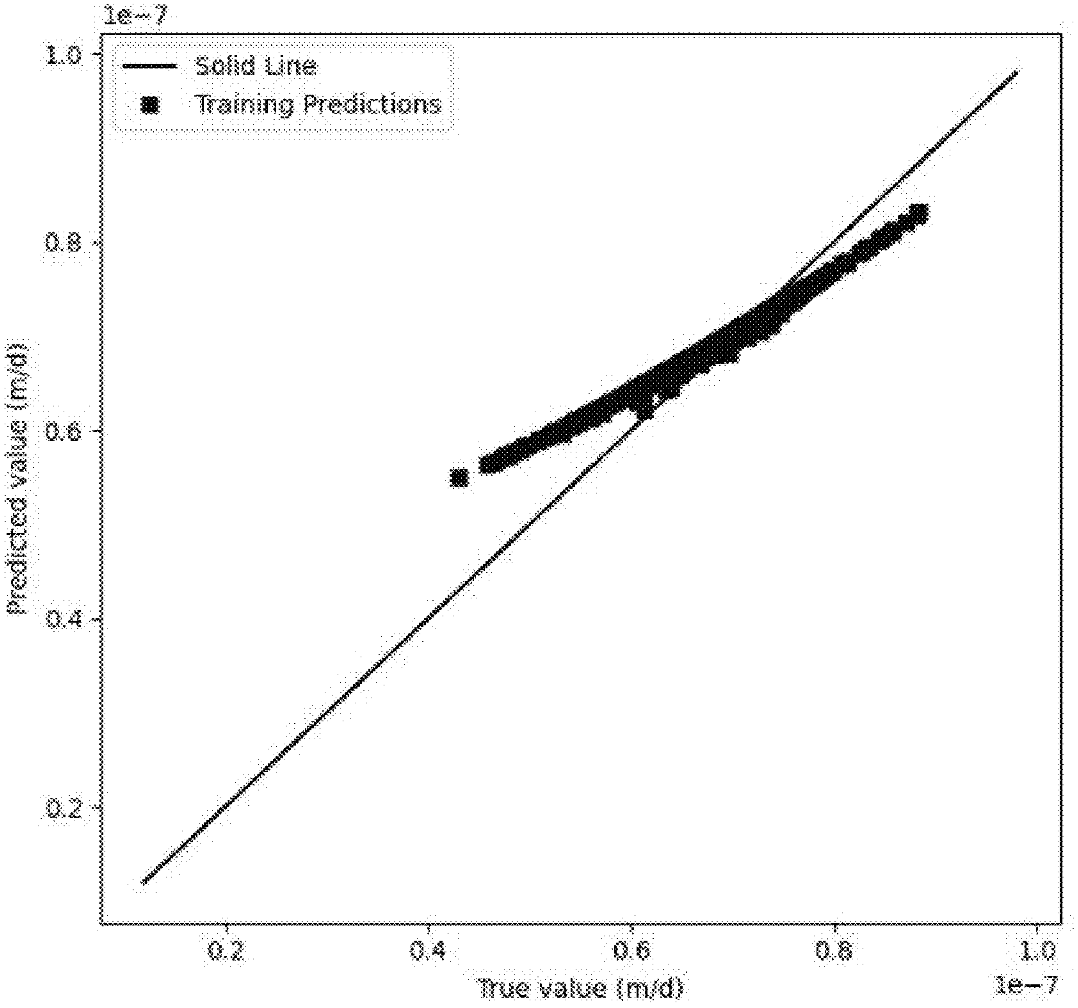
FIG. 4A is a comparison diagram of predicted values versus actual values of discharge during the training period of an LSTM model.
Figure 4B:
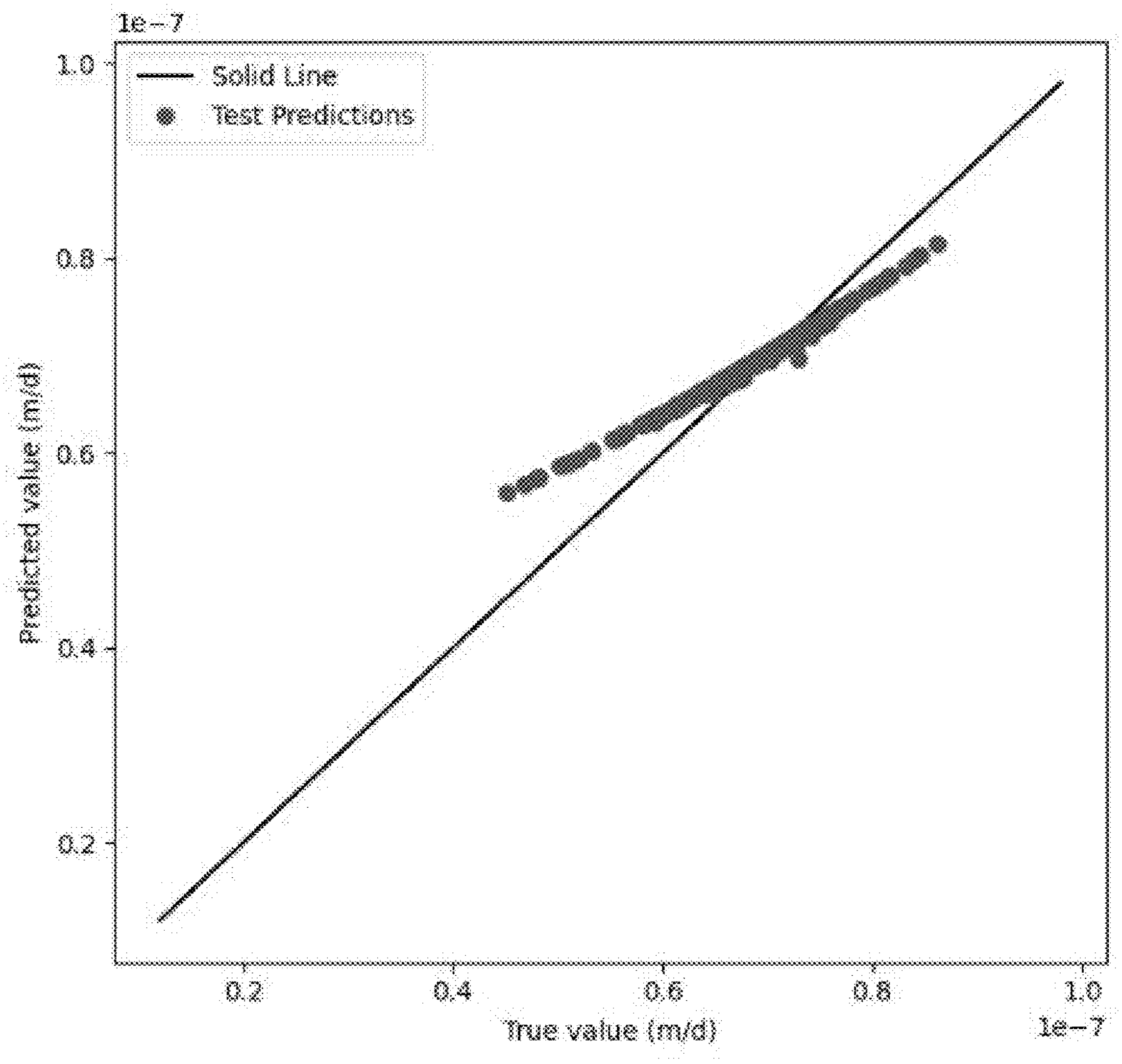
FIG. 4B is a comparison diagram of predicted values versus actual values of discharge during the testing period of the LSTM model.
Figure 4C:
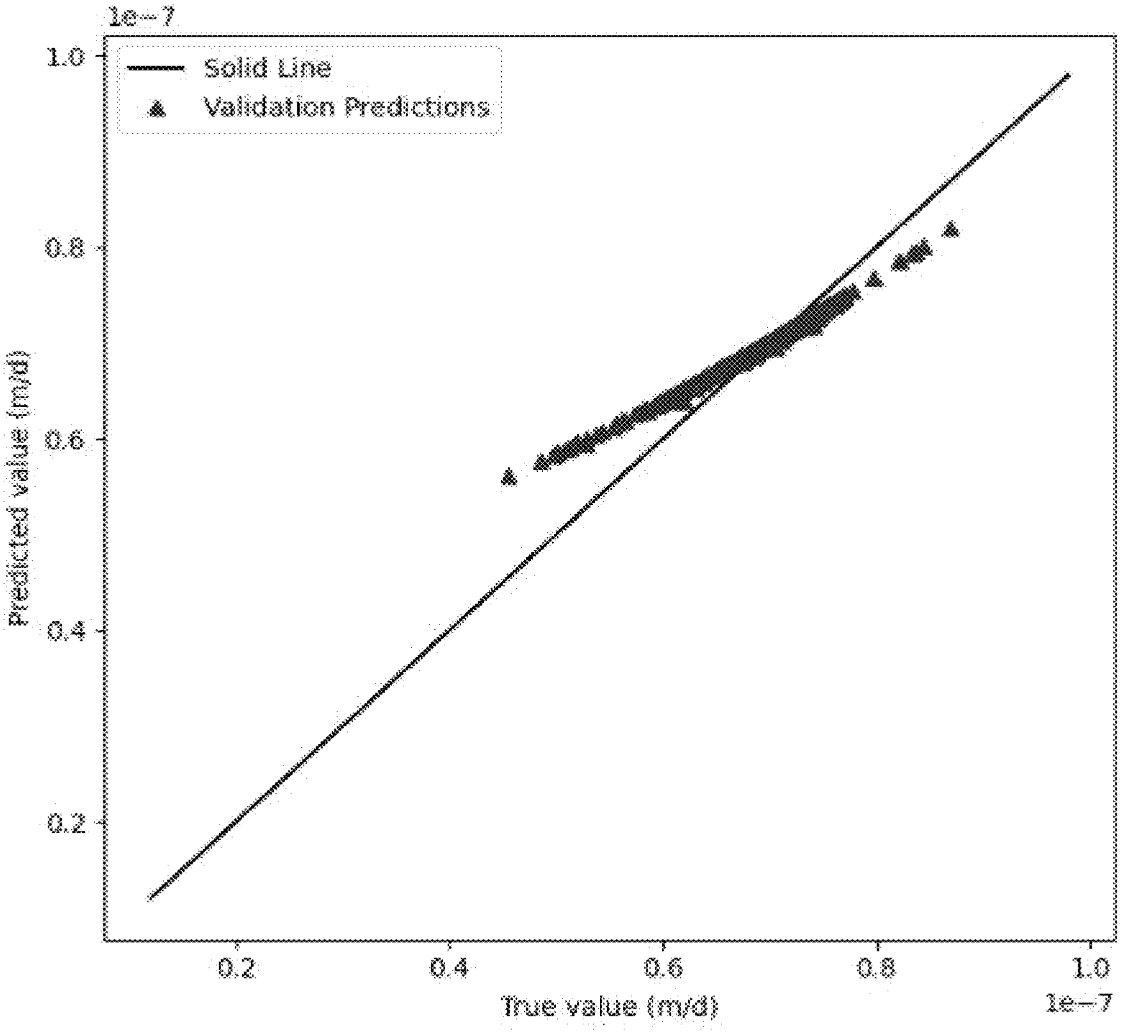
FIG. 4C is a comparison diagram of predicted values versus actual values of discharge during the validation period of the LSTM model.
Figure 4D:
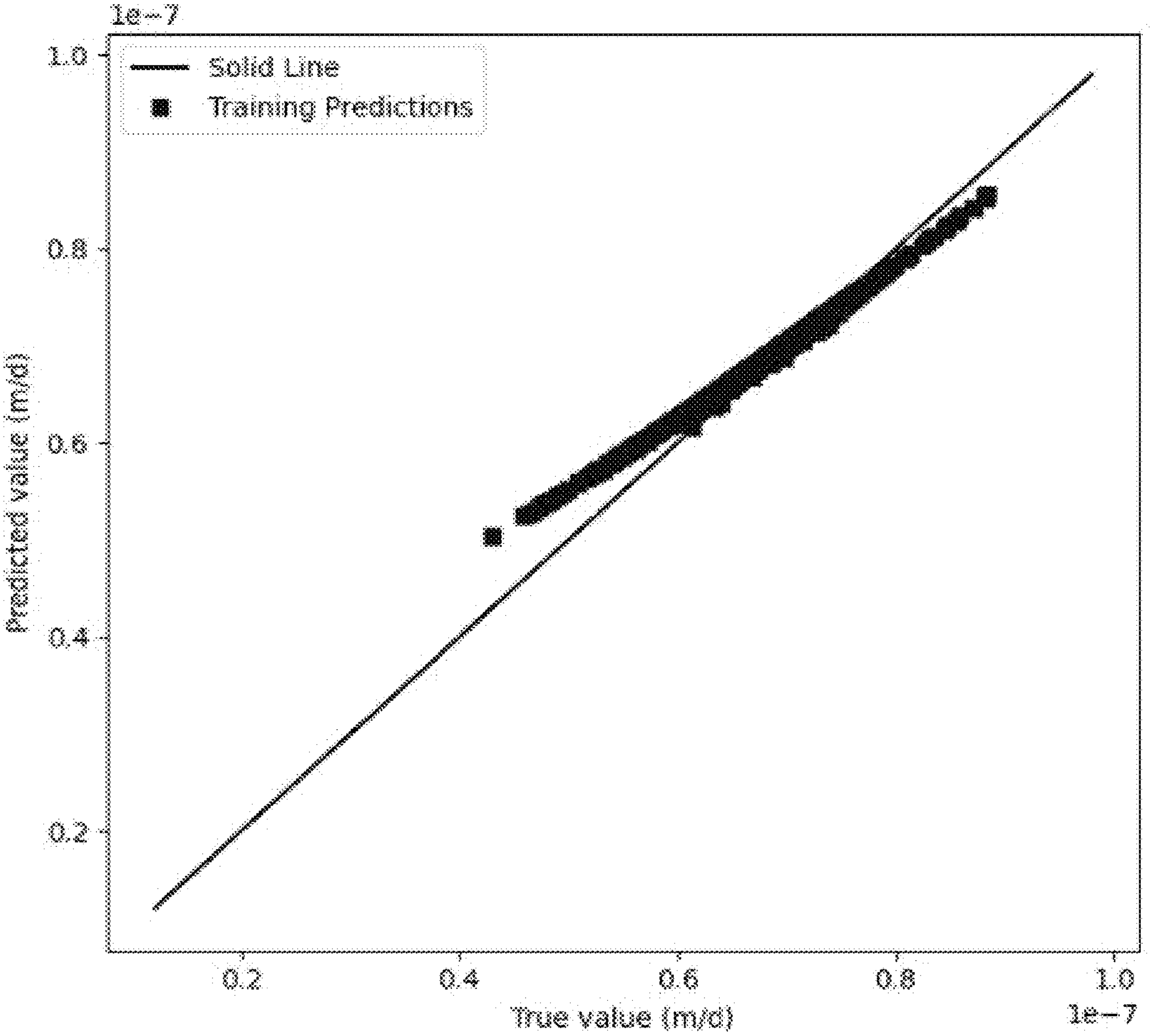
FIG. 4D is a comparison diagram of predicted values versus actual values of discharge during the training period of a GRU model.
Figure 4E:
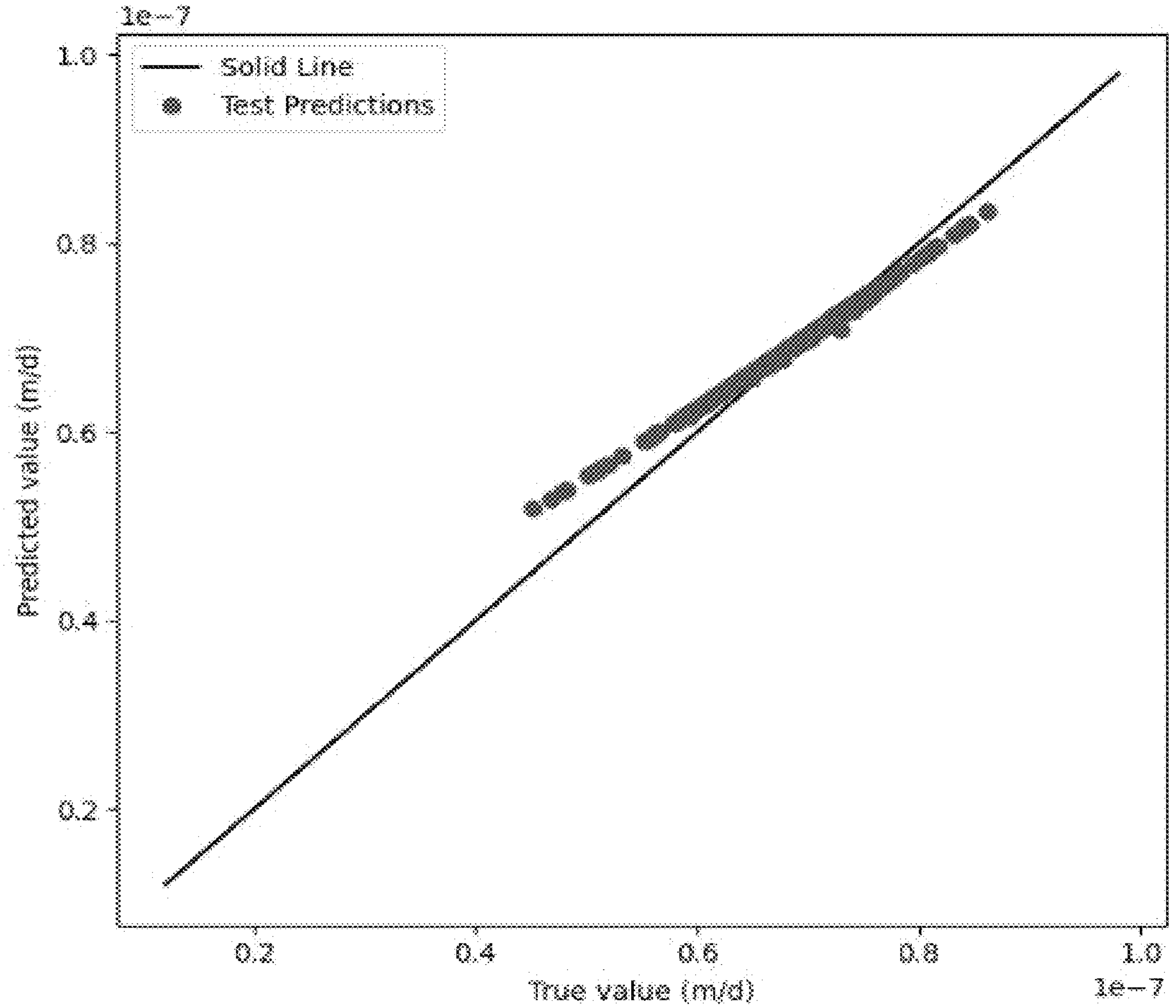
FIG. 4E is a comparison diagram of predicted values versus actual values of discharge during the testing period of the GRU model.
Figure 4F:
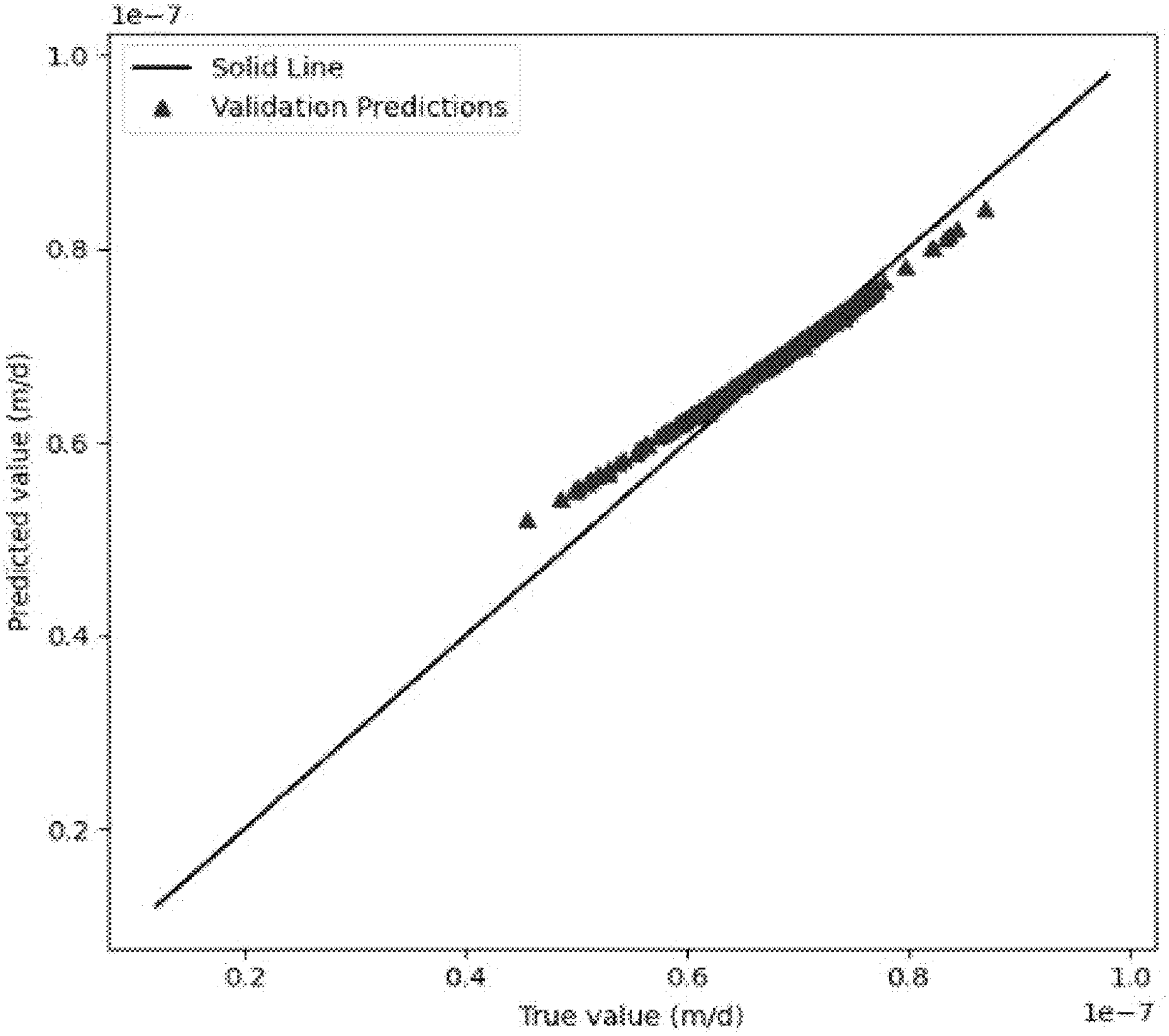
FIG. 4F is a comparison diagram of predicted values versus actual values of discharge during the validation period of the GRU model.
Figure 4G:
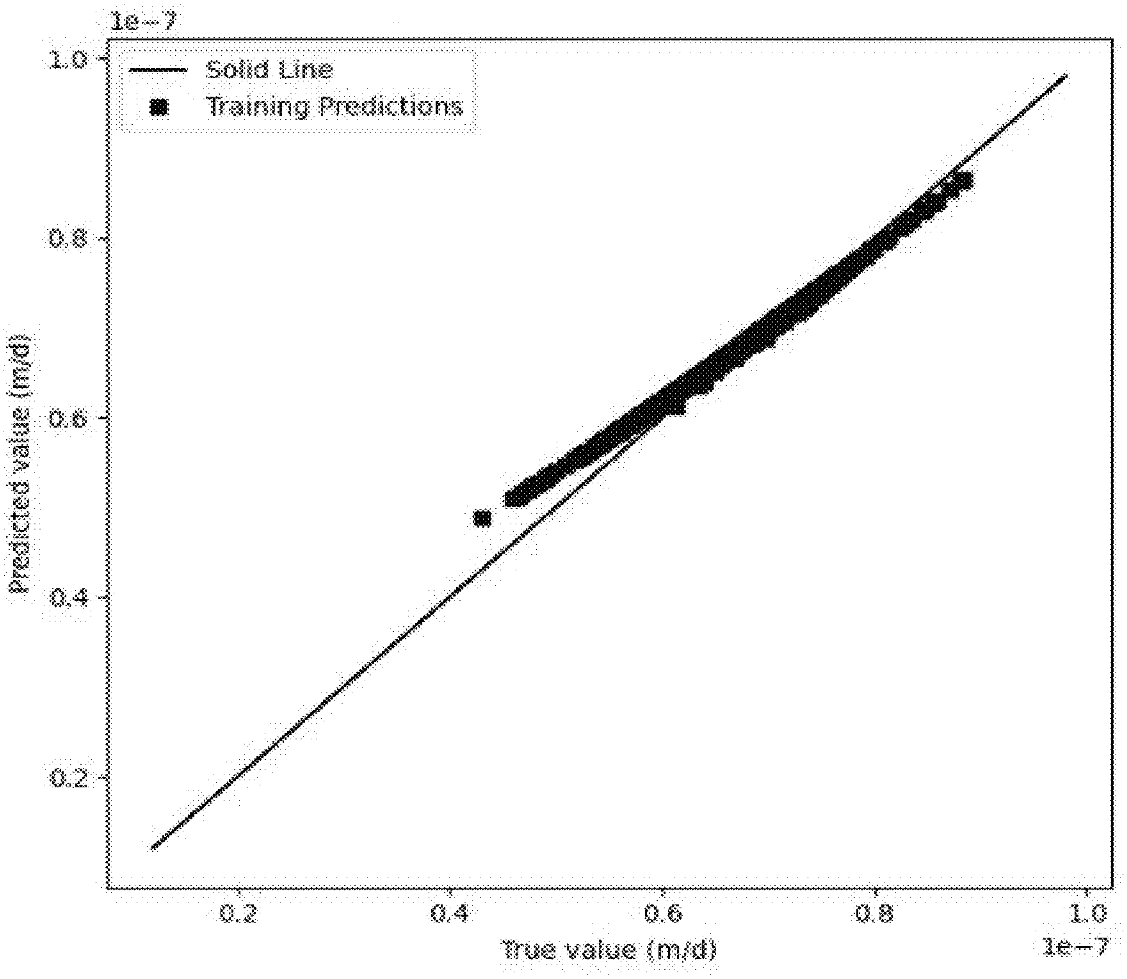
FIG. 4G is a comparison diagram of predicted values versus actual values of discharge during the training period of the LSTM-GRU model.
Figure 4H:
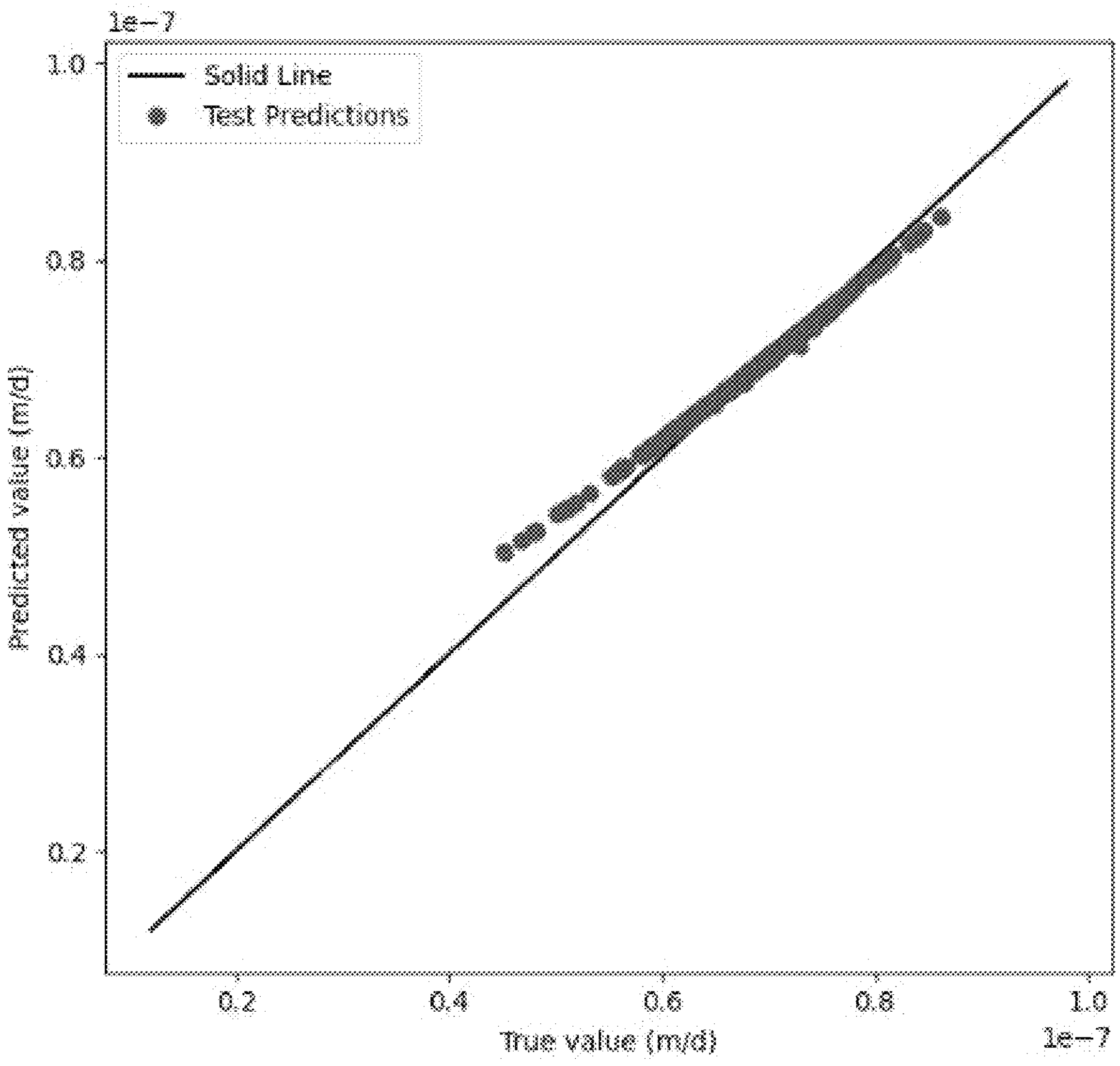
FIG. 4H is a comparison diagram of predicted values versus actual values of discharge during the testing period of an LSTM-GRU model.
Figure 4I:
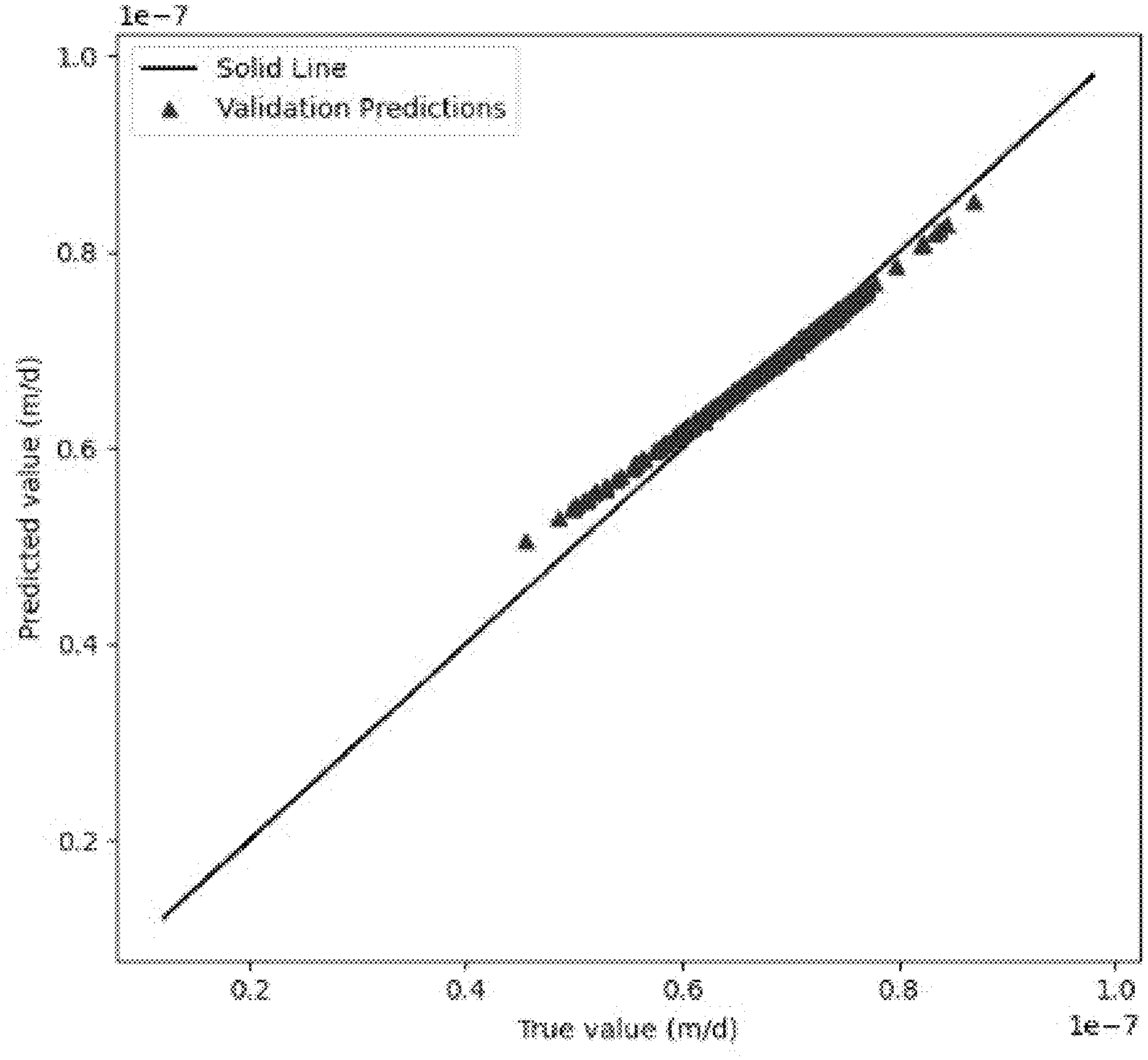
FIG. 4I is a comparison diagram of predicted values versus actual values of discharge during the validation period of the LSTM-GRU model.
Figure 5A:
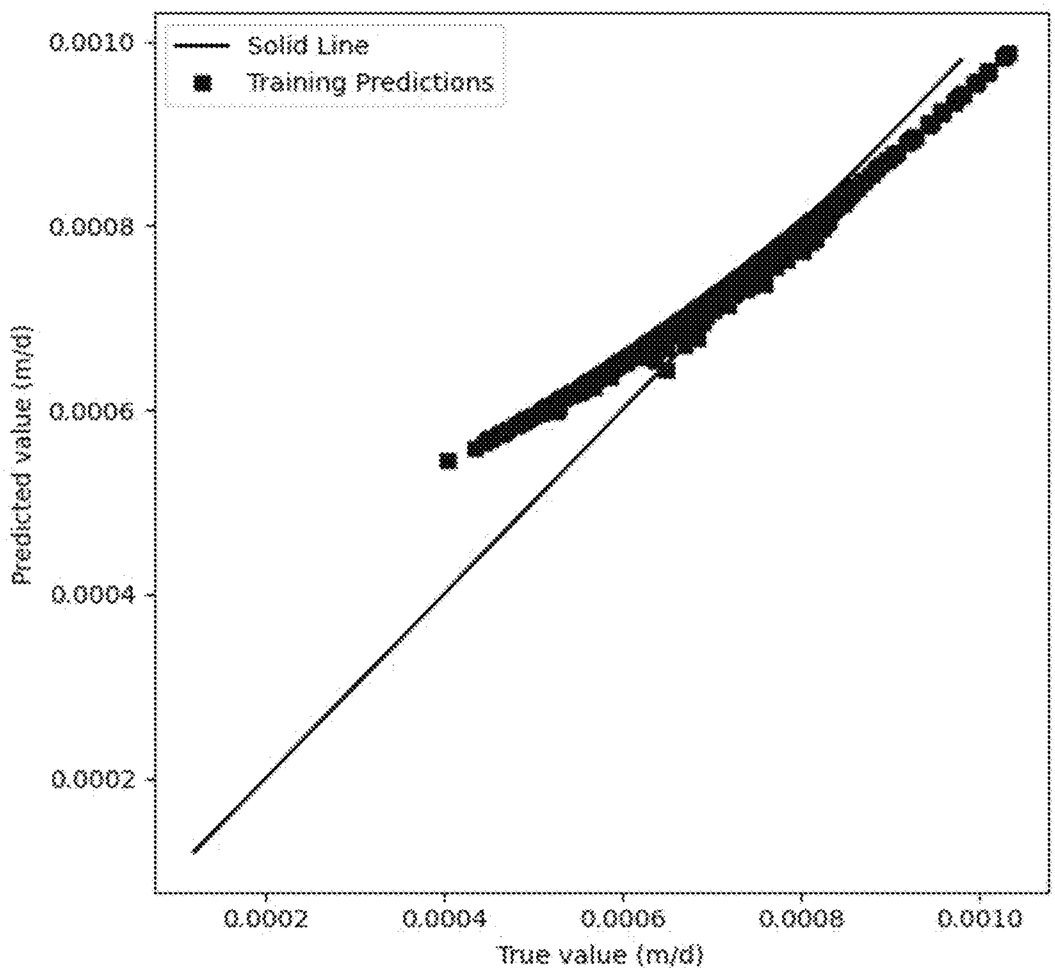
FIG. 5A is a comparison diagram of predicted values versus actual values of drainage during the training period of an LSTM model.
Figure 5B:
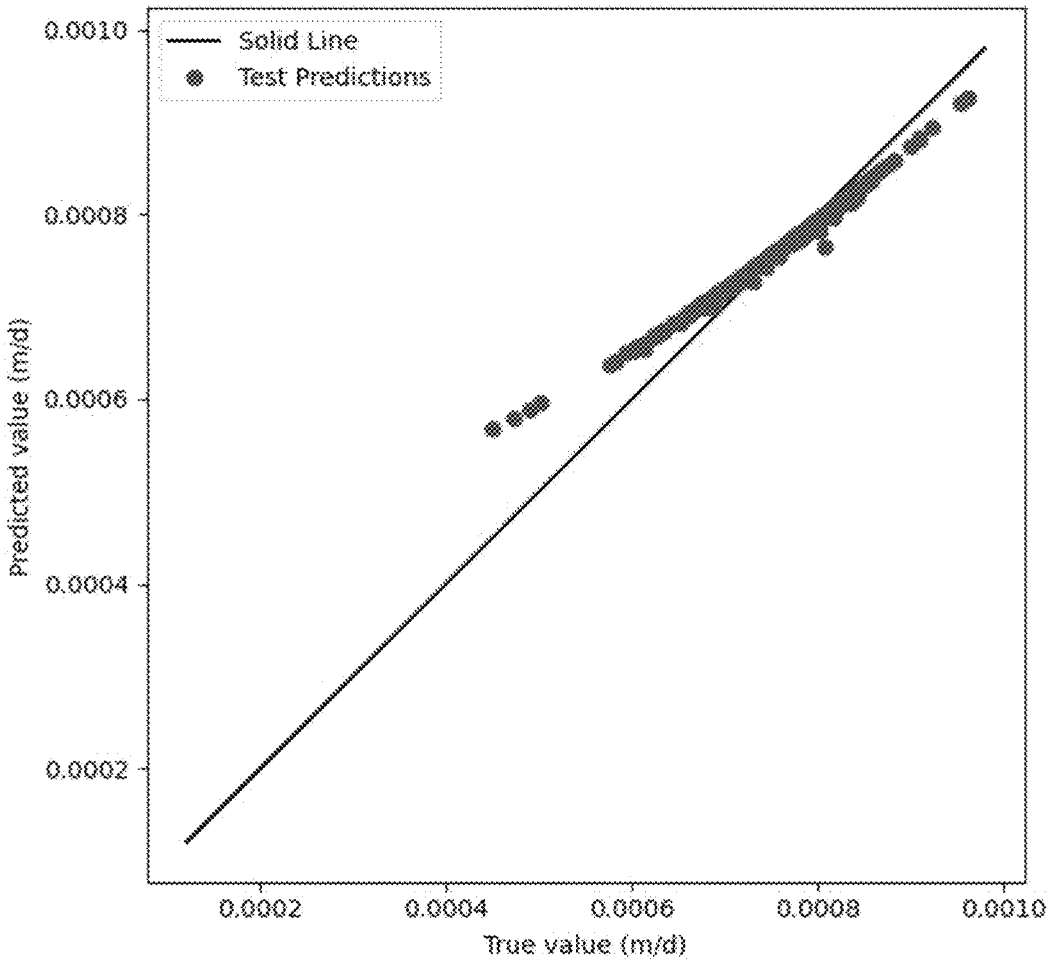
FIG. 5B is a comparison diagram of predicted values versus actual values of drainage during the testing period of the LSTM model.
Figure 5C:
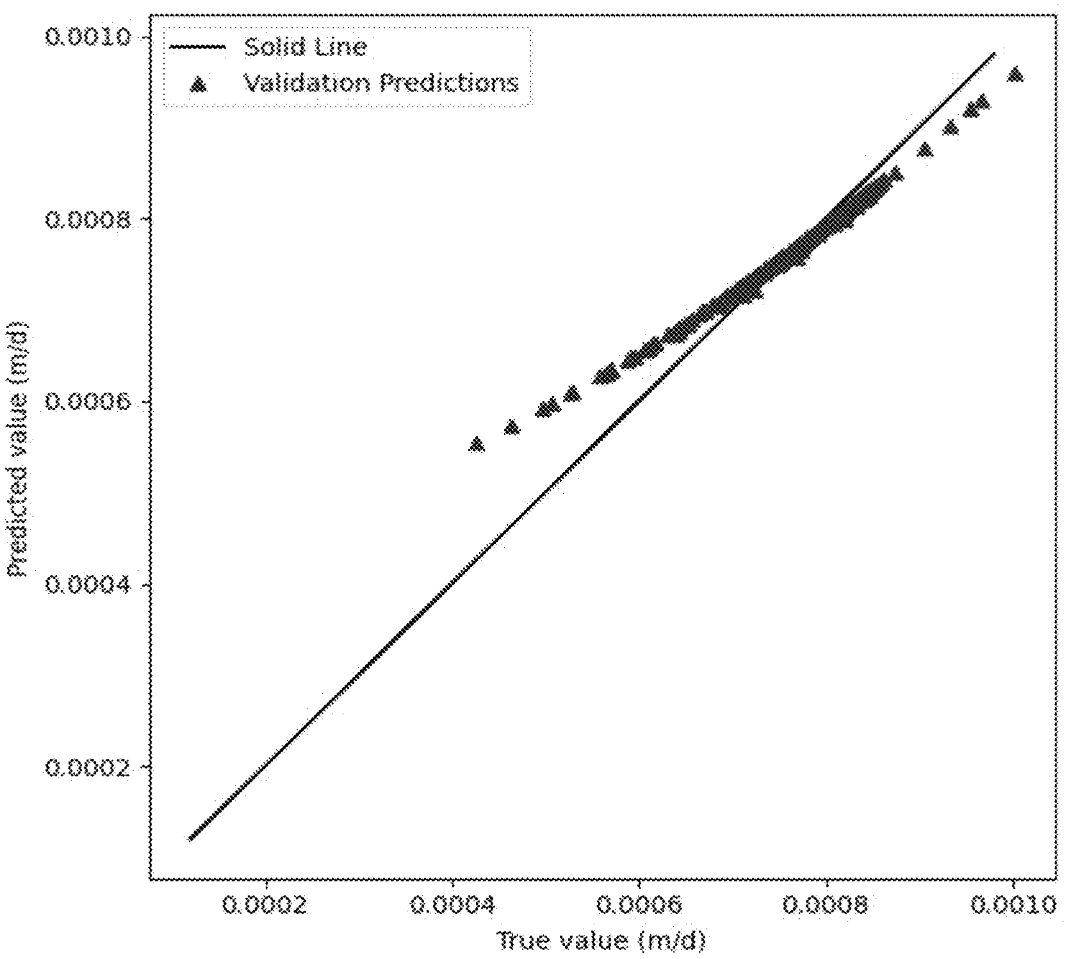
FIG. 5C is a comparison diagram of predicted values versus actual values of drainage during the validation period of the LSTM model.
Figure 5D:
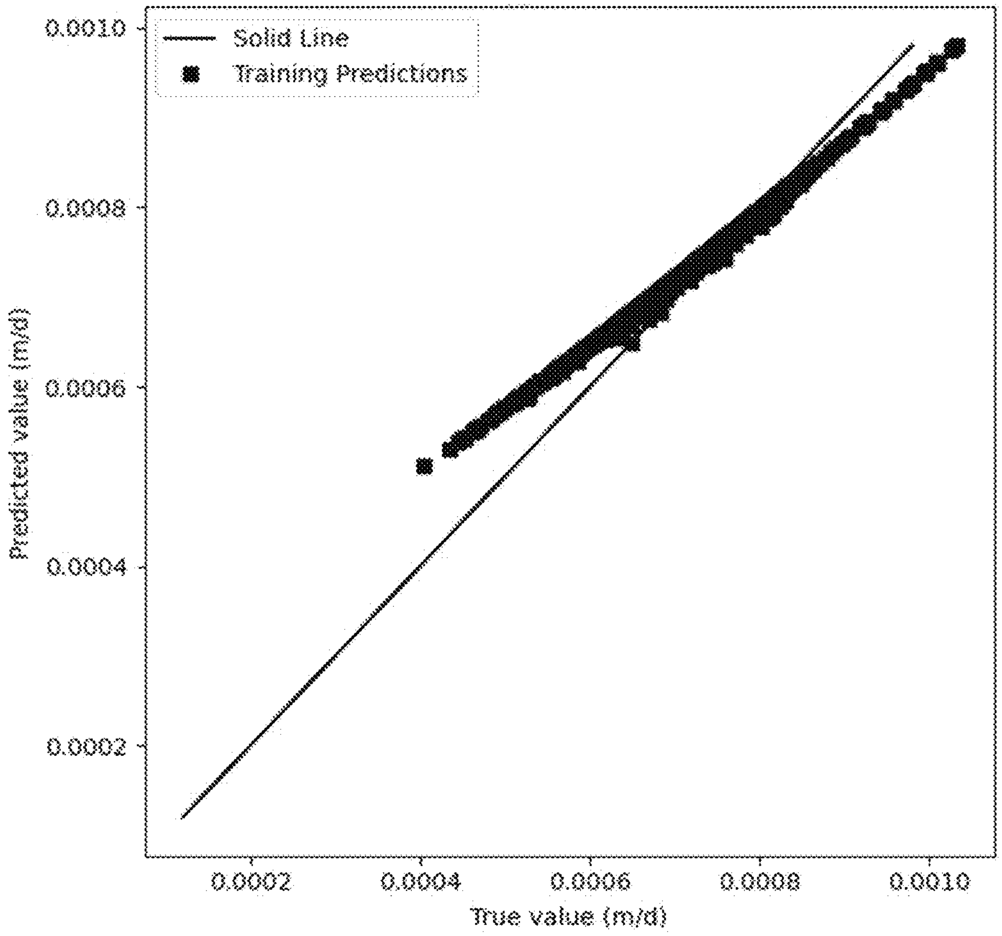
FIG. 5D is a comparison diagram of predicted values versus actual values of drainage during the training period of a GRU model.
Figure 5E:
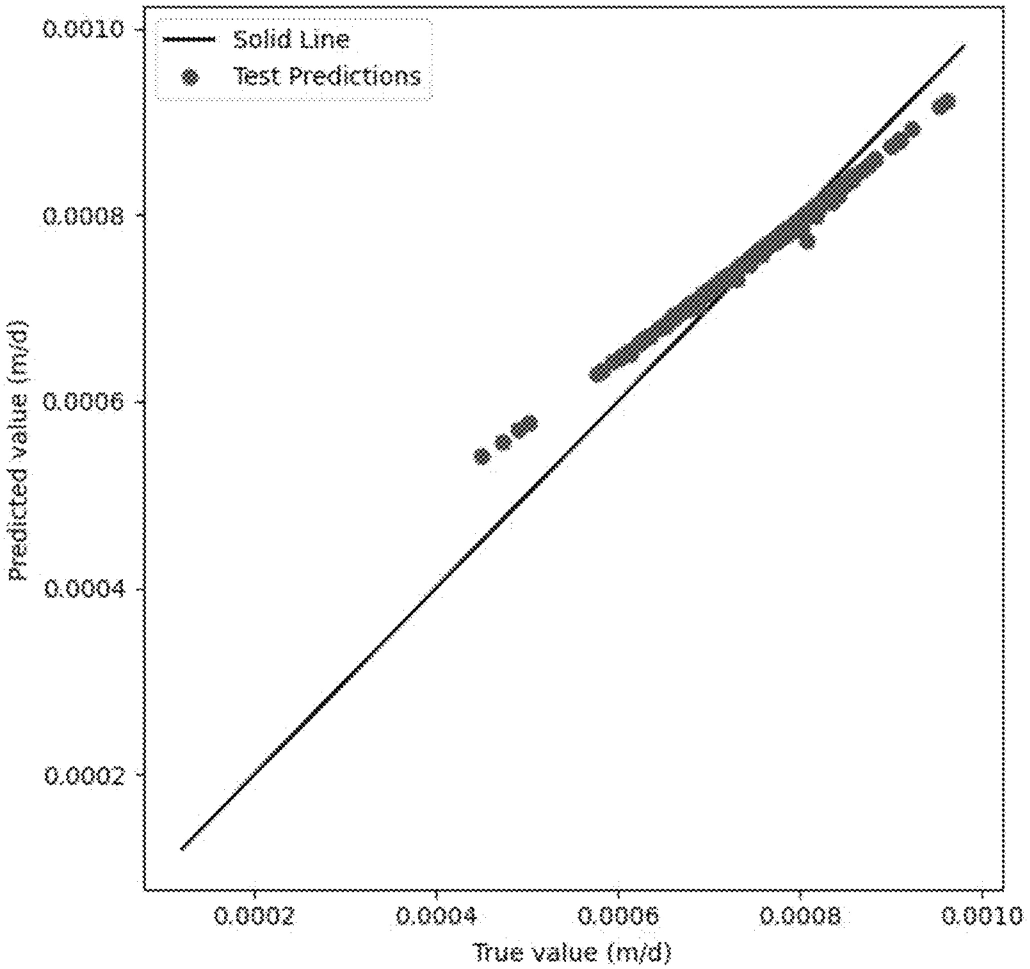
FIG. 5E is a comparison diagram of predicted values versus and actual values of drainage during the testing period of the GRU model.
Figure 5F:
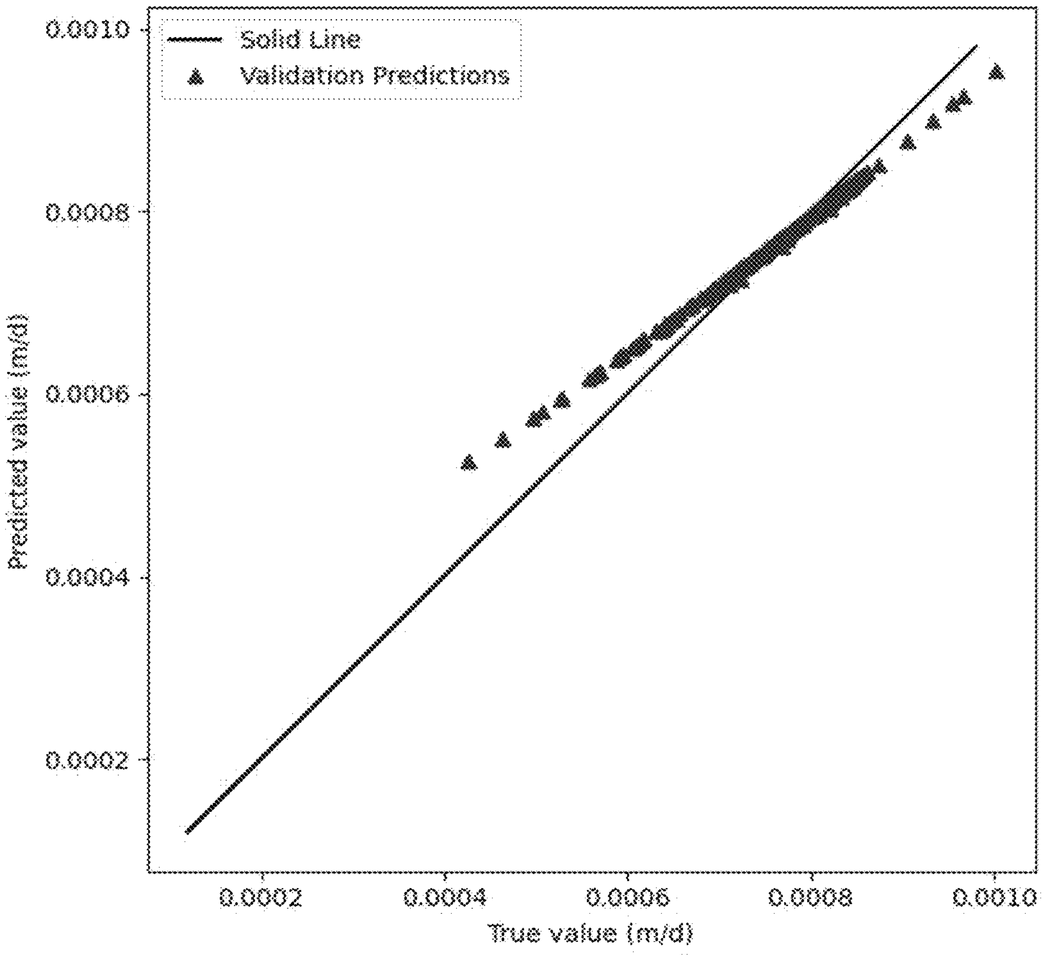
FIG. 5F is a comparison diagram of predicted values versus actual values of drainage during the validation period of the GRU model.
Figure 5G:
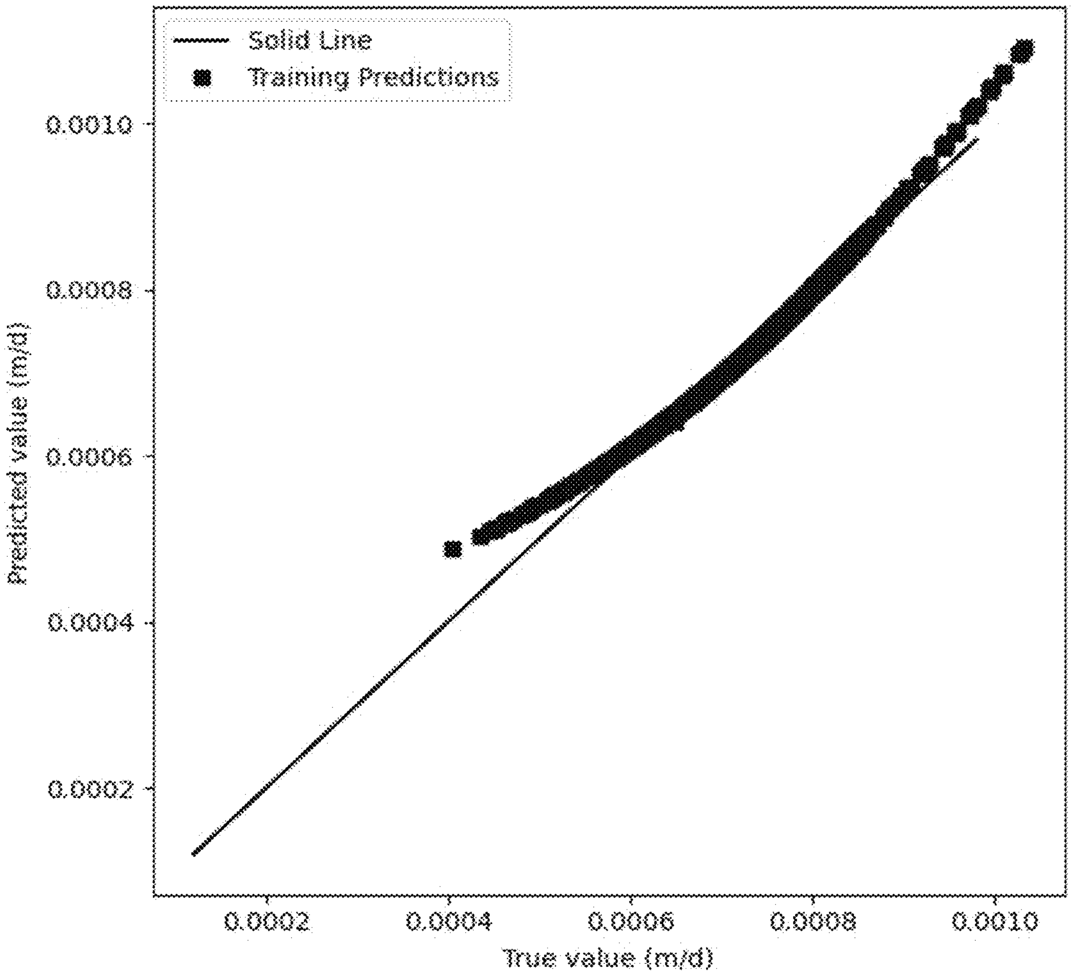
FIG. 5G is a comparison diagram of predicted values versus actual values of drainage during the training period of an LSTM-GRU model.
Figure 5H:
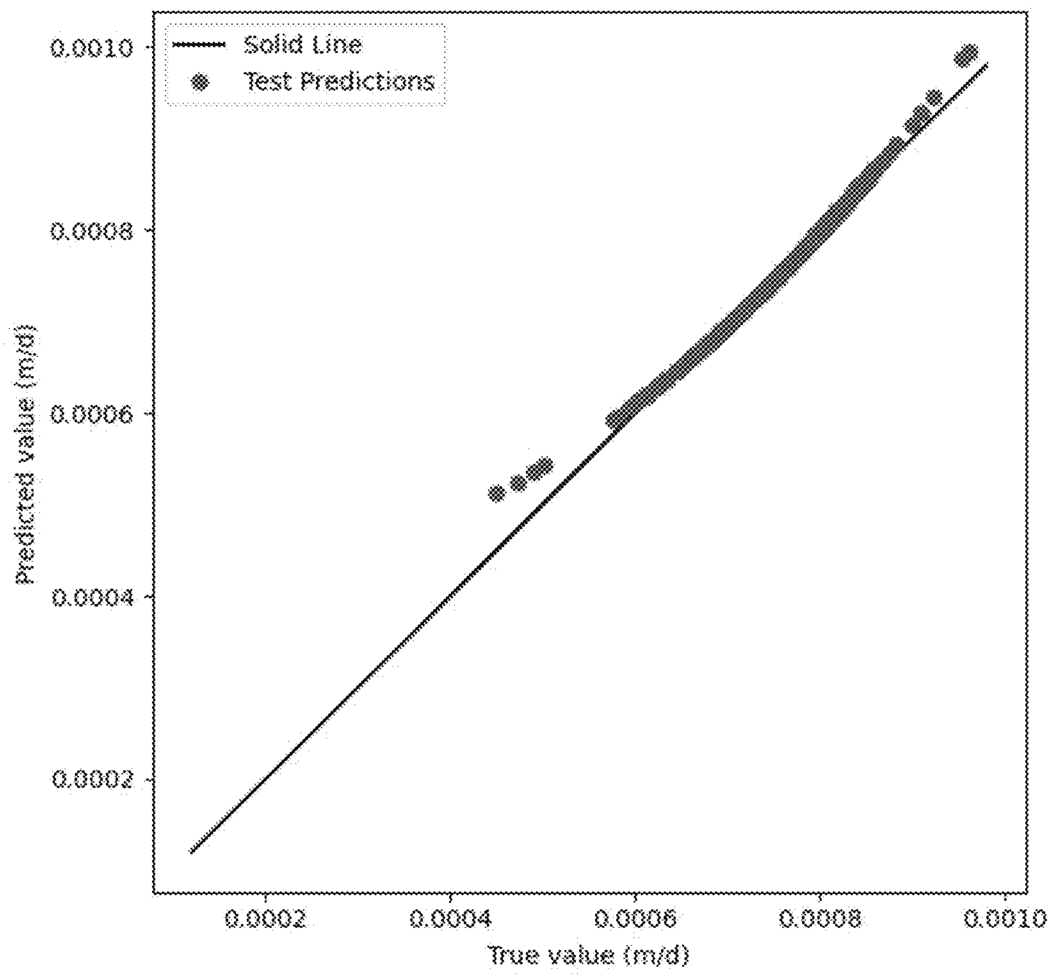
FIG. 5H is a comparison diagram of predicted values versus actual values of drainage during the testing period of the LSTM-GRU model.
Figure 5I:
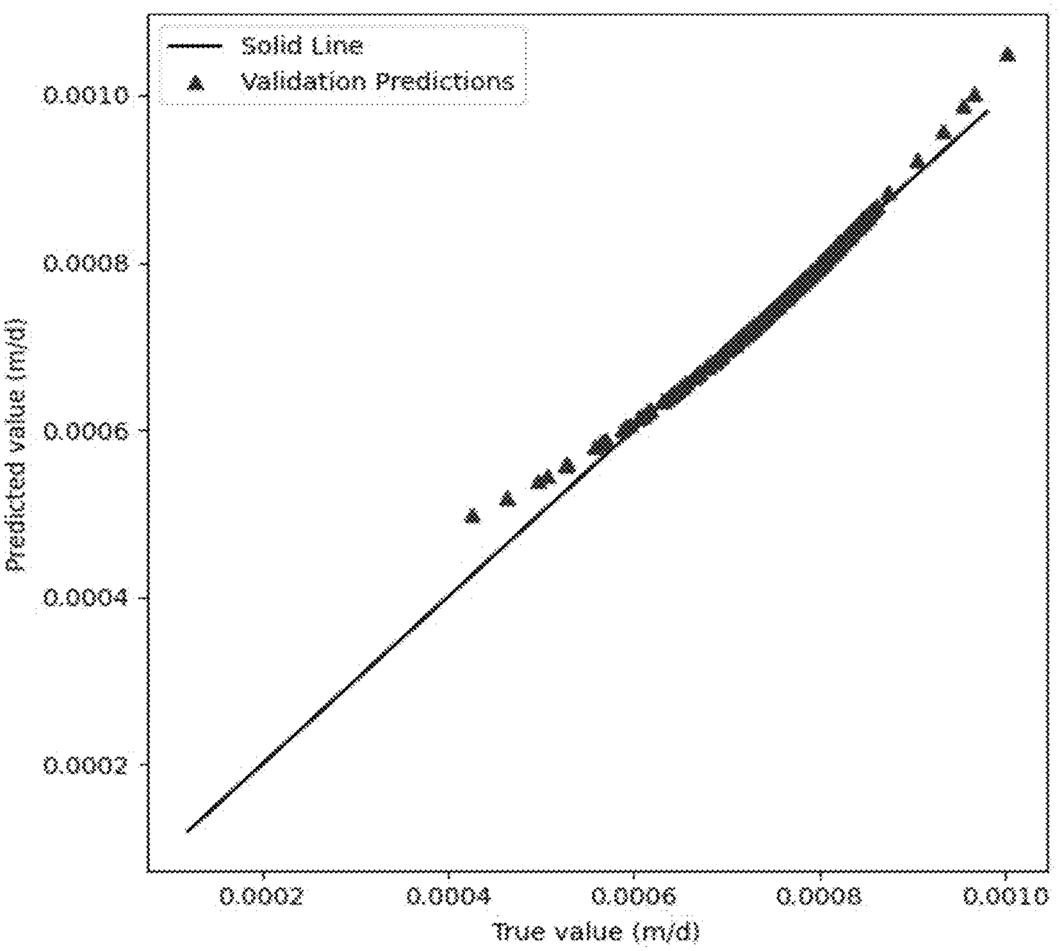
FIG. 5I is a comparison diagram of predicted values and actual values of drainage during the validation period of the LSTM-GRU model.
Figure 6:
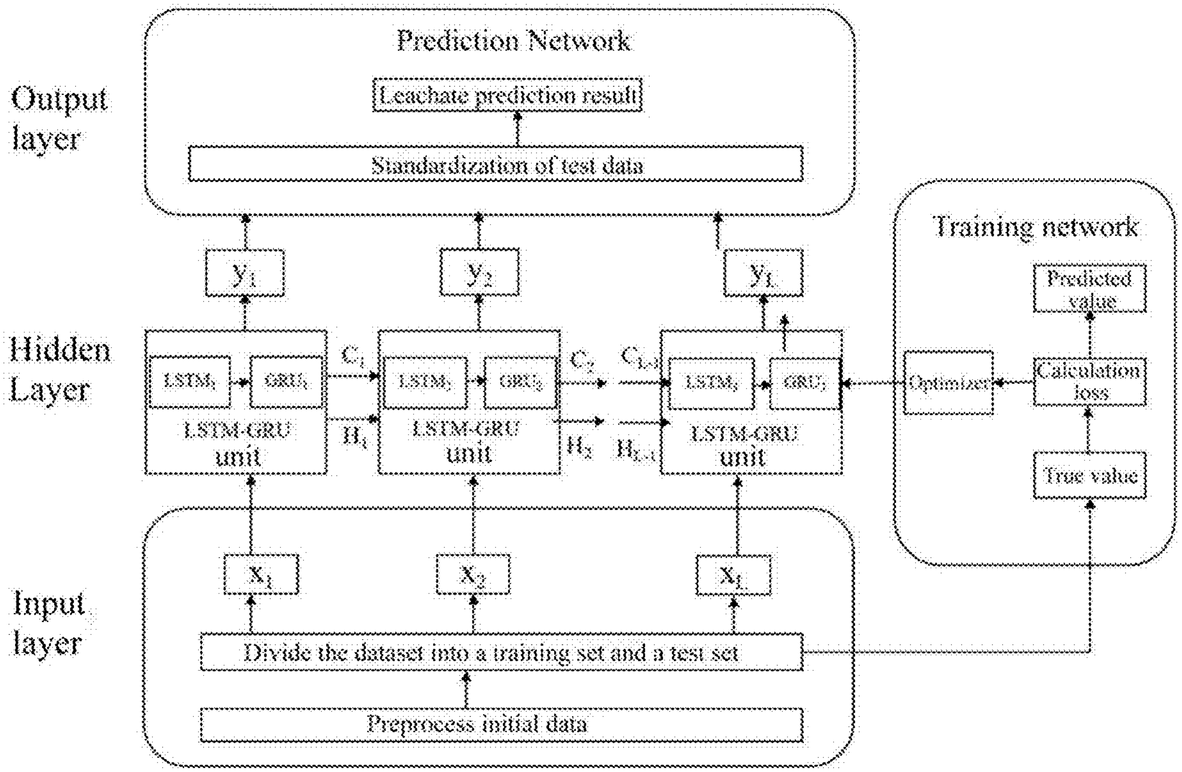
FIG. 6 is a flowchart of a prediction model framework provided by an embodiment of the present disclosure.

Referring to FIGS. 2 and 3, among the 3643 sets of simulation data used in this embodiment, 2914 sets are used for training, 364 sets for testing, and 364 sets for validation. The characteristics encompass discharge and drainage, while also including influencing factors such as a landfill environment and a waste landfill condition. Three neural network models are constructed: LSTM, GRU, and LSTM-GRU are respectively used for the prediction of discharge and drainage. The LSTM is suitable for long-term dependent and memorized sequence data, while the GRU focuses more on the processing of short-term information. LSTM-GRU combines the advantages of both. The fitting effect results of the predicted values and actual values of discharge and drainage of the three neural network prediction models are shown in FIGS. 2 and 3. The chart illustrates the fitting situation between the predicted values and the actual values of the models Furthermore, the training process of the model incorporates steps such as data preprocessing, feature scaling, and model optimization. To ensure the adaptability of the model to the data, cross-validation techniques are employed to guarantee the randomness and representativeness of the training and validation sets. Data preprocessing includes missing value processing, outlier detection, and feature standardization to ensure the accuracy and consistency of the data. During model training, various combinations of hyperparameters are experimented with, and the model parameters that perform the best are selected based on the evaluation results from the validation set.

Specifically, after comprehensively considering the performance of the LSTM, GRU, and LSTM-GRU models in the prediction of discharge and drainage, the generalization capabilities, the ability to processing abnormal data, and the capacity to capture long-term and short-term features of each model are further explored. A more in-depth analysis of the adaptability and robustness of the model is conducted for different scenarios and data characteristics. The importance of data preprocessing and model optimization is emphasized, thereby improving the performance and robustness of the model.

Furthermore, the performance metrics of the three different models (LSTM, GRU, LSTM-GRU) during the training and validation periods include a coefficient of determination (R2), a mean squared error (MSE), a root mean squared error (RMSE), a mean absolute error (MAE), and a mean absolute percentage error (MAPE).

Referring to FIGS. 4 and 5, the relationship diagrams between the predicted values versus the actual values of discharge and drainage during the training, testing, and validation periods are shown in FIGS. 4 and 5. First, during the training and validation periods, the LSTM-GRU model perform the best across all metrics. Its R2 value is the highest and the error metrics (MSE, RMSE, MAE) are the lowest, with MAPE also being the smallest among the three models. This indicates that the LSTM-GRU model exhibits superior predictive performance and accuracy in forecasting the discharge of a landfill leachate. Secondly, when comparing the standalone LSTM and GRU models, the GRU model slightly outperforms the LSTM model. The GRU model exhibits higher R2 values during both the training and validation periods compared to the LSTM model, with smaller error metrics (MSE, RMSE, MAE), demonstrating more robust performance. Overall, the LSTM-GRU model demonstrates the best predictive capability, followed by the GRU model, while the LSTM model perform relatively less favorably. This comparison can aid in selecting the most suitable model for predicting the leachate in the landfill. In summary, by comparing with the LSTM and GRU models, it is found that this composite model has more advantages. It can be concluded that the LSTM-GRU network is the optimal choice for predicting sequence data such as discharge and drainage.

Specifically, the relevant explanation for FIG. 2 is as follows: The x-axis corresponds to the date; the y-axis corresponds to the discharge; Predicted Discharge is the predicted value of discharge; Ture Discharge is the true value of discharge.

Specifically, the relevant explanation of FIG. 3 is as follows: The x-axis corresponds to the date; the y-axis corresponds to the drainage; Predicted Discharge is the predicted value of drainage; Ture Discharge is the true value of drainage.

Specifically, the relevant explanation of FIG. 4 is as follows: The x-axis corresponds to the measured value; the y-axis corresponds to the predicted value of discharge. Training Predictions are the training prediction values; Test Predictions are the predicted values for testing; Validation Predictions are the validation predicted values.

Specifically, the relevant explanation for FIG. 5 is as follows: The x-axis corresponds to the measured value; the y-axis corresponds to the predicted value of drainage; Training Predictions are the training prediction values; Test Predictions represent the predicted values for testing; and Validation Predictions are the validation predicted values.

The beneficial effects of the present disclosure are as follows:

The present disclosure utilizes the long short-term memory recurrent neural network-gated recurrent unit neural network algorithm to obtain the landfill leakage risk prediction model, such that the prediction model is suitable not only for long-term dependent sequence data but also for short-term information processing, thereby improving the practicality and reliability of the model prediction.

The various embodiments in this specification are described in a progressive manner, with each embodiment focusing on the differences from the other embodiments. For the same or similar parts among the various embodiments, reference can be made to each other.

In this text, specific examples are used to elaborate on the principles and implementation methods of the present disclosure. The description of the above embodiments is intended to aid in understanding the method and core ideas of the present disclosure; meanwhile, for those skilled in the art, based on the concept of the present disclosure, there may be changes in the specific implementation and scope of application. In summary, the contents of this Specification should not be construed as limiting the present disclosure.

The invention claimed is:

1. A computer-implemented method for predicting a leakage risk of a landfill based on deep learning, comprising:

receiving, at a computer comprising one or more processors and a trained landfill leakage risk prediction model, data of a target leakage fluid monitored in real time at a target landfill, the data of the target leakage fluid comprising discharge data and drainage data of leachate;

standardizing, by the one or more processors, the data of the target leakage fluid to obtain target standard data;

inputting, by the one or more processors, the target standard data into the trained landfill leakage risk prediction model to obtain a landfill leakage risk prediction result, wherein the landfill leakage risk prediction result comprises a predicted discharge value and a predicted drainage value in future; and outputting the landfill leakage risk prediction result for use in landfill leakage management, wherein constructing the trained landfill leakage risk prediction model comprises:

collecting sample leachate data from the target landfill;

preprocessing the sample leachate data to obtain preprocessed data, wherein the preprocessing comprises missing value processing, abnormal value detection, and feature standardization;

randomly dividing the preprocessed data into a training set and a test set;

constructing, in PyTorch, ahybrid neural network structure combining along short-term memory recurrent neural network and a gated recurrent unit neural network (LSTM-GRU) to obtain an original training model, wherein the long short-term memory is configured to learn long-term dependencies of time-series leachate data and the gated recurrent unit is configured to process short-term sequence information;

inputting the training set into the original training model for training to obtain predicted values;

calculating loss data between the predicted values and the training set based on a loss function; and determining, by the one or more processors, whether the loss data has converged; and if the loss data has converged, obtaining the trained landfill leakage risk prediction model;

if the loss data has not converged, updating, using an optimizer, model parameters of the hybrid neural network structure, and returning to the step of inputting the training set into an original training model for training, wherein the optimizer is an adaptive moment estimation algorithm, and a learning rate (Ir) parameter of the optimizer is 0.001.

wherein outputting the landfill leakage risk prediction result for use in landfill leakage management. comprises:

determining that the target landfill has experienced leakage, in response to the predicted discharge value being greater than a predetermined discharge threshold and the predicted drainage value being less than a predetermined drainage threshold.

2. The method for predicting a leakage risk of a landfill based on deep learning according to claim 1, further comprising:

performing, by the one or more processors, a posterior distribution calculation on the trained landfill leakage risk prediction model to obtain posterior distribution data; and evaluating a fitting condition of the trained landfill leakage risk prediction model based on the posterior distribtuion data.

3. The method for predicting a leakage risk of a landfill based on deep learning according to claim 1, wherein the loss function comprises: a mean square error, a root mean square error, a mean absolute error, and a mean absolute percentage error.

4. The method for predicting a leakage risk of a landfill based on deep learning according to claim 2, wherein the posterior distribution comprises: a coefficient of determination, a mean squared error, a root mean squared error, a mean absolute error, and a mean absolute percentage error.

* * * * *